United States Patent [19]
Larsen

[11] Patent Number: 5,841,710
[45] Date of Patent: Nov. 24, 1998

[54] DYNAMIC ADDRESS REMAPPING DECODER

[75] Inventor: Corey L. Larsen, Marsing, Id.

[73] Assignee: Micron Electronics, Inc.

[21] Appl. No.: 801,820

[22] Filed: Feb. 14, 1997

[51] Int. Cl.⁶ .................................................. G11C 8/00
[52] U.S. Cl. ................ 365/200; 365/230.06; 365/230.03
[58] Field of Search .................................. 365/200, 201, 365/230.03, 230.06, 185.09

[56] References Cited

U.S. PATENT DOCUMENTS

| | | | |
|---|---|---|---|
| 3,772,652 | 11/1973 | Hilberg | 365/200 |
| 3,800,294 | 3/1974 | Lawlor | 395/182.03 |
| 4,376,300 | 3/1983 | Tsang | 365/200 |
| 4,493,075 | 1/1985 | Anderson et al. | 371/10 |
| 4,807,191 | 2/1989 | Flannagan | 371/10.3 |
| 4,837,747 | 6/1989 | Dosaka et al. | 371/10 |
| 4,881,200 | 11/1989 | Urai | 365/230.03 |
| 4,908,798 | 3/1990 | Urai | 365/230.03 |
| 4,918,662 | 4/1990 | Kondo | 365/210 |
| 5,060,197 | 10/1991 | Park et al. | 365/200 |
| 5,126,973 | 6/1992 | Gallia et al. | 365/200 |
| 5,268,866 | 12/1993 | Feng et al. | 365/200 |
| 5,270,976 | 12/1993 | Tran | 365/200 |
| 5,327,380 | 7/1994 | Kersh, III et al. | 365/195 |
| 5,349,556 | 9/1994 | Lee | 365/200 |
| 5,392,247 | 2/1995 | Fujita | 365/200 |
| 5,406,565 | 4/1995 | MacDonald | 371/10.3 |
| 5,475,648 | 12/1995 | Fujiwara | 365/230.06 |
| 5,491,664 | 2/1996 | Phelan | 365/200 |
| 5,528,553 | 6/1996 | Saxena | 365/230.03 |
| 5,548,553 | 8/1996 | Cooper et al. | 365/200 |
| 5,576,999 | 11/1996 | Kim et al. | 365/200 |
| 5,668,763 | 9/1997 | Fujioka et al. | 365/200 |

*Primary Examiner*—Tan T. Nguyen
*Attorney, Agent, or Firm*—Knobbe, Martens, Olson, & Bear, LLP

[57] ABSTRACT

A memory system comprising a memory controller, first and second memory-arrays and a decoder is provided. The memory arrays comprise at least one section having all good memory locations, and at least one section having at least one faulty memory location. The decoder is responsive to the memory controller for selectively enabling data transfer between the controller and the sections of the first and second memory arrays having all good memory locations.

19 Claims, 20 Drawing Sheets

DYNAMIC ADDRESS REMAPPING DECODER

BACKGROUND OF THE INVENTION

The present invention relates generally to data storage arrays of integrated circuits or semiconductor chips, such as dynamic random access memory (DRAM) devices. More particularly, the present invention is directed towards the utilization of memory devices having faulty memory locations.

A memory unit is an integral part of any microcomputer system and its primary purpose is to store programs and data. Dynamic random access memory ("DRAM") is one example of a memory unit. DRAM devices are usually assembled on a single in-line memory module ("SIMM"). Typically, on a SIMM printed circuit board, there are several DRAMs arranged in a manner allowing simultaneous access to the stored data. These DRAMs, however, are sometimes manufactured with faulty memory locations. It is desired to incorporate DRAMs having faulty memory locations on a SIMM while still maintaining proper SIMM functionality.

One technique of utilizing DRAMs having faulty locations is to incorporate an application specific integrated circuit ("ASIC") on the SIMM. The ASIC is programmed to redirect data addressed to the faulty locations to another source of back-up memory on the SIMM, so that faulty locations are avoided. In another technique, DRAMs are tested individually before and after assembly onto a SIMM printed circuit board. More often, because of interferences due to mounting on the SIMM, the data gathered while testing the DRAMs before SIMM assembly is used to assist in programming the ASIC to mask the faulty locations. As a result of testing the DRAMs, the extent and layout of the faulty locations are determined by generating a "fail map" for each DRAM. The ASIC is programmed to mask out faulty locations by referring to and matching the faulty locations in the generated fail map. As will be apparent in the following paragraph, this form of masking process using a fail map is often inefficient, inaccurate and time consuming.

Furthermore, several memory systems utilizing fail maps exist in the prior art. A programmable read only memory ("PROM") utilized to recognize the addresses of faulty memory locations to cause a redundant memory to be selected for data storage was described in Tsang (U.S. Pat. No. 4,376,300). A separate permanent memory used to record bad cells and devices for continuous reference to avoid access to defective cells was described in Anderson et al. (U.S. Pat. No. 4,493,075). A MAP identifying memory chips having faulty memory locations was used to connect data lines to a good location in a spare memory chip as disclosed in MacDonald (U.S. Pat. No. 5,406,565). Another memory system compares the address of a data signal to a stored address of a defective memory cell and, if they agree, redirects the data signal to a spare memory cell (Fujiwara, U.S. Pat. No. 5,475,648). These systems and methods are time consuming because the matching process must sort through relatively large fail maps to try and locate a matching map. Also, they are inaccurate because the faults generated when the DRAMS are on a SIMM will likely only show a portion of the failures that were detected in the DRAM fail maps generated prior to assembly on a SIMM. Moreover, should too many defective memory locations be present in the main memory devices, these prior art techniques may be susceptible to overcrowding the spare memory device(s), or overlapping a redirected data signal on a defective memory location in the spare memory. These problems lead to the need for more error correction algorithms, reduced memory capacity, and, consequently, reduced data transfer rates.

In view of the foregoing problems, there is a need to manage memory devices having faulty memory locations efficiently and accurately, while maintaining simple and cost-effective designs.

SUMMARY OF THE INVENTION

The present invention includes a cost effective and simple memory access system. In one respect, the present invention includes a memory system comprising a memory controller, a first memory array comprising at least one section having all good memory locations, and at least one section having at least one faulty memory location, and a second memory array comprising at least one section having all good memory locations, and at least one section having at least one faulty memory location. Furthermore, the system inludes a decoder coupled to the memory controller, and the first and second memory arrays. The decoder is responsive to the memory controller for selectively enabling data transfer between the controller and the sections of the first and second memory arrays having all good memory locations.

In some embodiments, the present invention also includes improved data storage methods. Thus, the present invention also comprises a method of storing and retrieving data. The method may comprise the steps of writing data to an address in a first memory array having functional data storage circuitry at said address, writing said data to the address in a second memory array having faulty data storage circuitry at the address, and retrieving the data from the first memory element.

Further embodiments of the present invention include DRAM memory modules comprising a plurality of DRAM semiconductor chips, with each one of the DRAM semiconductor chips comprising an output enable terminal. The module further includes a decoder circuit having an address input terminal and a plurality of output enable signals, wherein the plurality of output enable signals are connected to corresponding ones of the output enable terminals on each of the DRAM semiconductor chips. The decoder selectively asserts output enable signals in response to the logical level of the address input terminal.

BRIEF DESCRIPTION OF THE DRAWINGS

These and other advantages of the present invention are better understood with reference to the drawings, in which.

DETAILED DESCRIPTION OF THE INVENTION

Reference is now made to the drawings wherein like numerals refer to like parts throughout this application.

Figure 1:
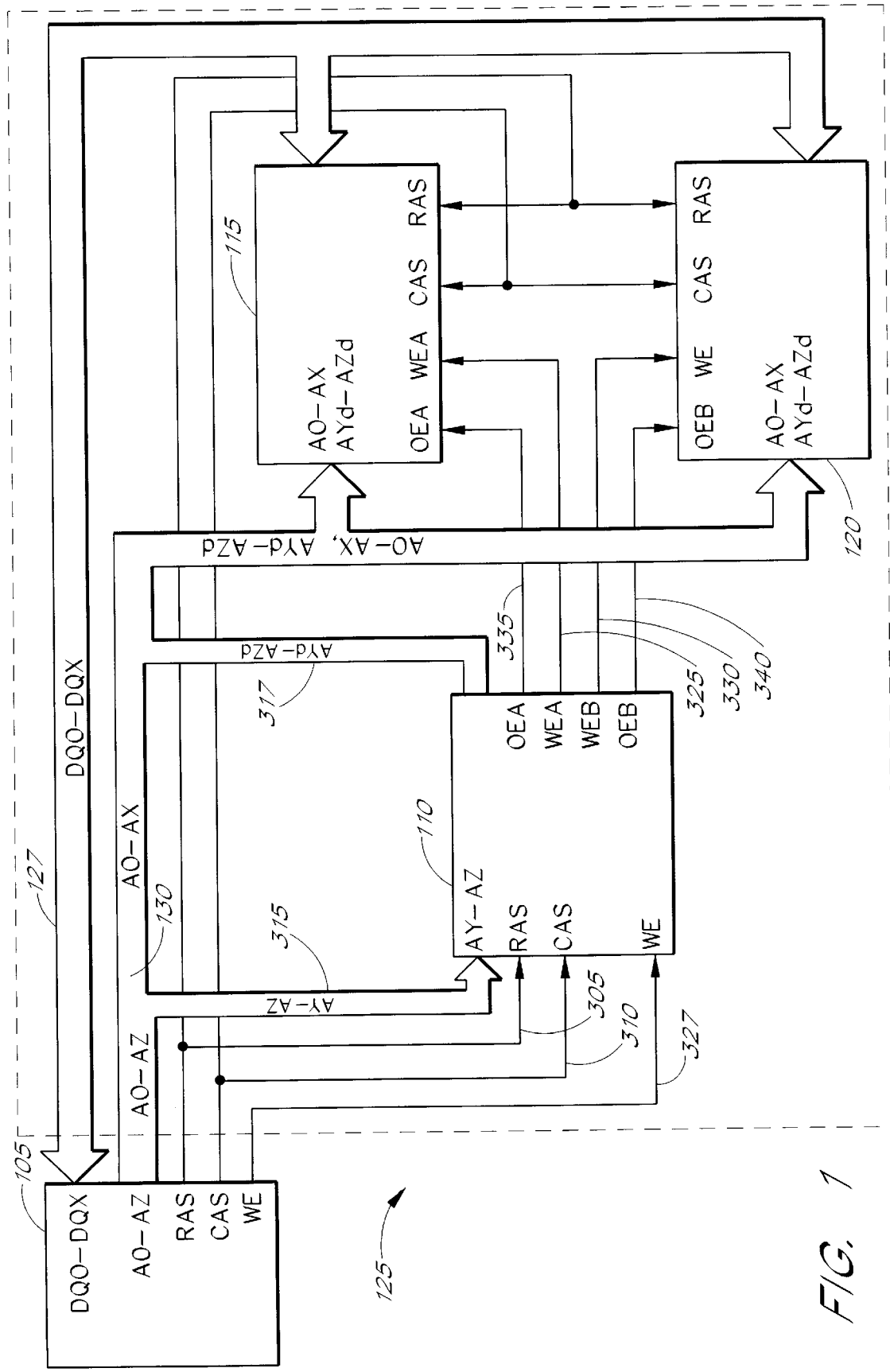
FIG. 1. is a system block diagram of an exemplary memory system for managing faulty memory locations.

A system block diagram of a first configuration of the memory system is depicted in FIG. 1. As shown in FIG. 1, the system comprises a memory controller 105, a redirectional decoder 110, a main memory array A 115, and a spare memory array B 120. The memory arrays A 115 and B 120 may comprise any form of electronic data storage device, including, for example, SRAM, EEPROM, and various DRAM devices such as S DRAM and EDO DRAM. The discussion which follows focuses on a specific DRAM implementation of the present invention, but it will be apparent to those of skill in the art that the present invention is not limited to any specific type or style of memory device.

In typical personal computer applications, the redirectional decoder 110 and the memory arrays 115, 120 may comprise part of a memory module 125 mounted on a PC motherboard, and may interface with the controller 105 in a manner well known to those of skill in the art. Suitable memory controllers 105 are commercially available from, for example, Intel Corp. as their 82430 PCIset Cache/Memory Subsystem. It is one advantage of some embodiments that the memory module 125 interfaces with the circuit of the controller 105 in a conventional manner even though an improved DRAM memory management system is implemented. In these embodiments, the DRAM module "appears" to the controller to comprise only all good memory arrays. Data (represented by bits DQ0–DQX) is routed between the circuit of the controller 105 and the arrays A 115 and B 120 via a bidirectional data bus 127, and the operation of the memory module 125 is governed by the state of the bits on an address bus 130 and the state of several control signals received by the module 125 from the controller 105. These include a row address strobe ("RAS") 305, a column address strobe ("CAS") 310, and a write enable ("WE") 327.

In certain embodiments, the RAS 305 and CAS 310 signals are routed as inputs to both the decoder 110 and the memory arrays A 115 and B 120. The WE 327 from the controller is also routed as an input to the decoder 110 and is not connected to the module 125 memory arrays A 115 or B 120. In addition, one or more of the lines of the address bus 130 is separated out on the memory module 125 and routed to the decoder circuit 110. In many applications, only the highest order address bit is routed to the decoder, although in some embodiments the two or three highest order bits are separated out and run to the decoder 110. As will be explained below, which address lines are routed to the decoder will depend on the nature of memory arrays A and B, and may in general comprise any subset or all of the address lines A0–AZ.

As will be also appreciated by those of skill in the art, the module 125 could receive many separate RAS, CAS, and WE signals from the controller 105 in many PC applications, and the DRAM chips on the module 125 would then each be controlled by a specific one of each of the RAS, CAS, and WE signals (although one set of RAS, CAS, and WE signals may control more than one DRAM on the module). For clarity, FIG. 1 illustrates only one set of RAS, CAS, and WE signals which would be routed to a specific DRAM or set of DRAMs on the module 125. In the general case, the decoder 110 may receive several or all of the RAS, CAS, and WE signals issued by the controller 105, and utilize each DRAM associated set in a manner completely analogous to that described below with respect to the RAS 305, CAS 310 and WE 327 signals explicitly illustrated in FIG. 1 and discussed in detail below.

The decoder 110 controls the operation of the two memory arrays A 115 and B 120 by controlling four decoder output signals. These may be an output enable array A ("OEA") 335 and B ("OEB") 340, and a write enable array A ("WEA") 325 and B ("WEB") 330. Also, the decoder 110 either passes without change or modifies the address bits AY–AZ it receives as inputs, and returns them to the address bus 130 and therefore to the memory arrays A 115 and B 120. Thus, memory array A 115 and/or B 120 can be disabled or selectively read from and written to under the control of the decoder 110.

Figure 2:
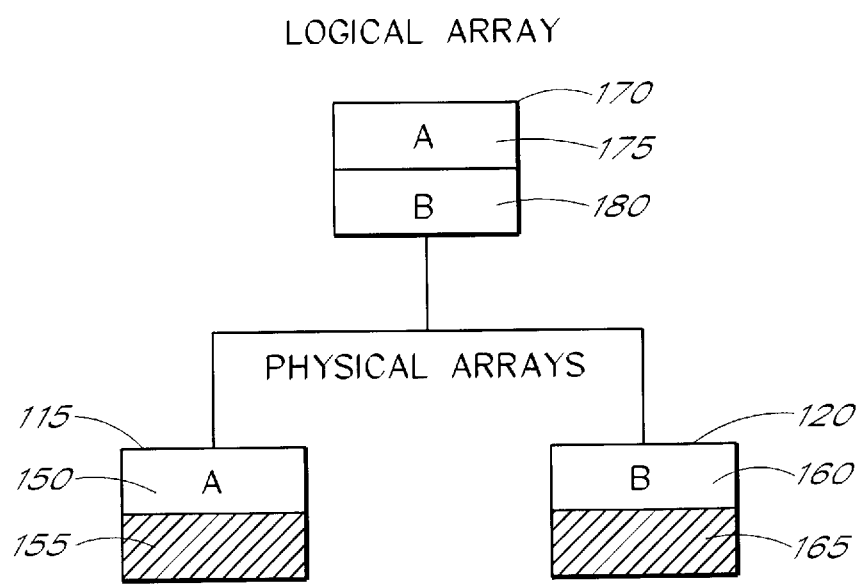
FIG. 2. is a block diagram of an exemplary transition from two memory arrays having faulty memory locations into a single memory array having all good memory locations.

Memory arrays A 115 and B 120 may include faulty memory locations, and the decoder 110 of the memory system shown in FIG. 1 may manage the data flow into the two memory arrays A 115 and B 120, so that the two memory arrays appear to the controller 105 as a single memory having all good memory locations. Typically, memory array A 115 and memory array B 120 are selected with inherent faulty memory locations. A block diagram of an exemplary transition from two memory arrays A 115 and B 120 having faulty memory locations into a single memory array having all good memory locations is shown in FIG. 2. In this example, rows containing all good memory locations occur in equivalent regions (i.e., same address ranges) in the memory arrays A 115 and B 120. As shown in FIG. 2, memory array A 115 is segmented into two physical sections. The top section 150 contains rows having all good memory locations, whereas the bottom section 155 contains rows having one or more faulty memory locations. Similarly, memory array B 120 is segmented into two physical sections. The top section 160 contains rows having all good memory locations, whereas the bottom section 165 contains rows having one or more faulty memory locations. The sum of good memory locations in memory arrays A 115 and B 120 may equal at least the sum of the memory locations of a logical memory array 170 having all good memory locations. In view of the segmentation of the memory arrays, one or more good memory locations may not be used. However, irrespective of the layout of the physical sections having all good memory locations, the sum of the usable memory locations may equal or exceed the sum of the memory locations of the logical memory array 170 having all good memory locations. Hence, the size of the physical sections 150 and 155 in memory array A 115, and sections 160 and 165 in memory array B 120, may vary as long as the sum of the memory locations in sections 150 and 160 combined equal or exceed the sum of the memory locations of the logical memory array 170.

In the embodiment shown in FIG. 2, the two arrays A 115 and B 120 contain rows having all good memory locations occurring in equivalent physical regions. As a specific example, each memory array A 115 and B 120 may comprise 16 mega-bits of memory organized as 4M×4 bits per addressable word. Each word would have a row address and column address between decimal 0–2047 which are sequentially specified on an 11-bit address line A0–A10 to access a 4-bit DRAM memory location. If section 150 equals half of the size of the memory array A 115, then the physical section 150 of the main memory array A 115 having all good memory locations would be described by the row address range of decimal 0–1023, defined by the 10 low order bits A0–A9 of the available row address space. Whereas, the physical section 155 of the main memory array A 115 having one or more faulty memory locations would be described by a row address range of decimal 1024–2047. In this example, the same address ranges would apply to the spare memory array B 120. Thus, the logical state of the row address bit A10 determines to which physical section the data is destined.

As will be described in more detail below with respect to FIGS. 3 through 5, if the good/faulty regions of the memory arrays A 115 and B 120 can be characterized as shown in FIG. 2, only A10, RAS 305, and WE 327 are routed to the decoder 110. This is because in the FIG. 2 embodiment, good/faulty memory regions are definable solely with reference to A10 of the row address. In this way, A10 of the row address defines an internal memory array "boundary," which serves to divide a region of the memory array containing all good locations from a region of the memory array containing at least some faulty locations.

Other embodiments, also described below, can have good/faulty memory regions defined by both row address and column address boundaries, and those boundaries could be defined by more than one bit of each of the row and column addresses. If a boundary is defined by one or more bits of the column address, then CAS 310 will also be routed to the decoder. Exactly which address lines are routed to the decoder will depend, of course, on the bits which define the memory region boundaries as defined above. These boundary defining bits of the addresses are also referred to as "significant bits" in the discussion below. It may further be noted that the specific example provided in FIG. 2 is of practical importance as DRAM process variations will often produce a batch of DRAMs which all contain faulty locations only in the upper or lower half of the row address space.

Those of skill in the art will now appreciate that other boundaries can be defined, and tailored to the particular DRAM memory faults which are present in memory array A 115 and memory array B 120. For example, if memory region 150 is one-fourth the size of the memory array A 115, then the physical section 150 of the main memory array A 115 having all good memory locations would be described by a row address range of 0–511, defined by the low order row address bits A0–A8 when row address bits A9 and A10 are both 0. Whereas, the physical section 155 of the main memory array A 115 having one or more faulty memory locations would be described by the row address range 512–2047 when either or both of A9 and A10 are 1. Thus, the logical state of the address bits A9 and A10 determine to which physical section the data is destined.

In this example, section 160 of the spare memory array B 120 would comprise an all good row address range of 0–1535, defined by those row addresses for which either A9 or A10 (or both) are 0. Accordingly, section 165 of the spare memory array B 120 would comprise a partially faulty row address range of 1536–2047, where row address bits A9 and A10 are both 1. In this embodiment, both A9 and A10 would be routed to the decoder 110. As the boundary between good/faulty memory regions is defined solely by row address bits, once again only RAS 305 would be routed to the decoder 110. In view of the above, it will be appreciated that numerous variations of memory arrays having different section layouts can be implemented to function as a single memory array when the sum of the usable good memory locations in the memory arrays equals or exceeds the sum of the memory locations of a single memory array having all good memory locations.

The circuitry of the decoder 110 may be tailored to the memory boundary definitions, which are in turn tailored to the particular faulty memory locations of the DRAMs being incorporated into the memory module 125. Thus, in a large volume memory manufacturing environment, memory arrays A 115 and B 120 can be selected from production runs which have faulty regions that allow a simple boundary definition. A simple boundary definition in turn allows for simple and inexpensive decoder 110 circuitry. Thus, some embodiments of the present invention thus reduce the cost and complexity of memory decoder circuits because memory arrays A and B can be chosen so that simple boundaries can be defined.

Figure 3:
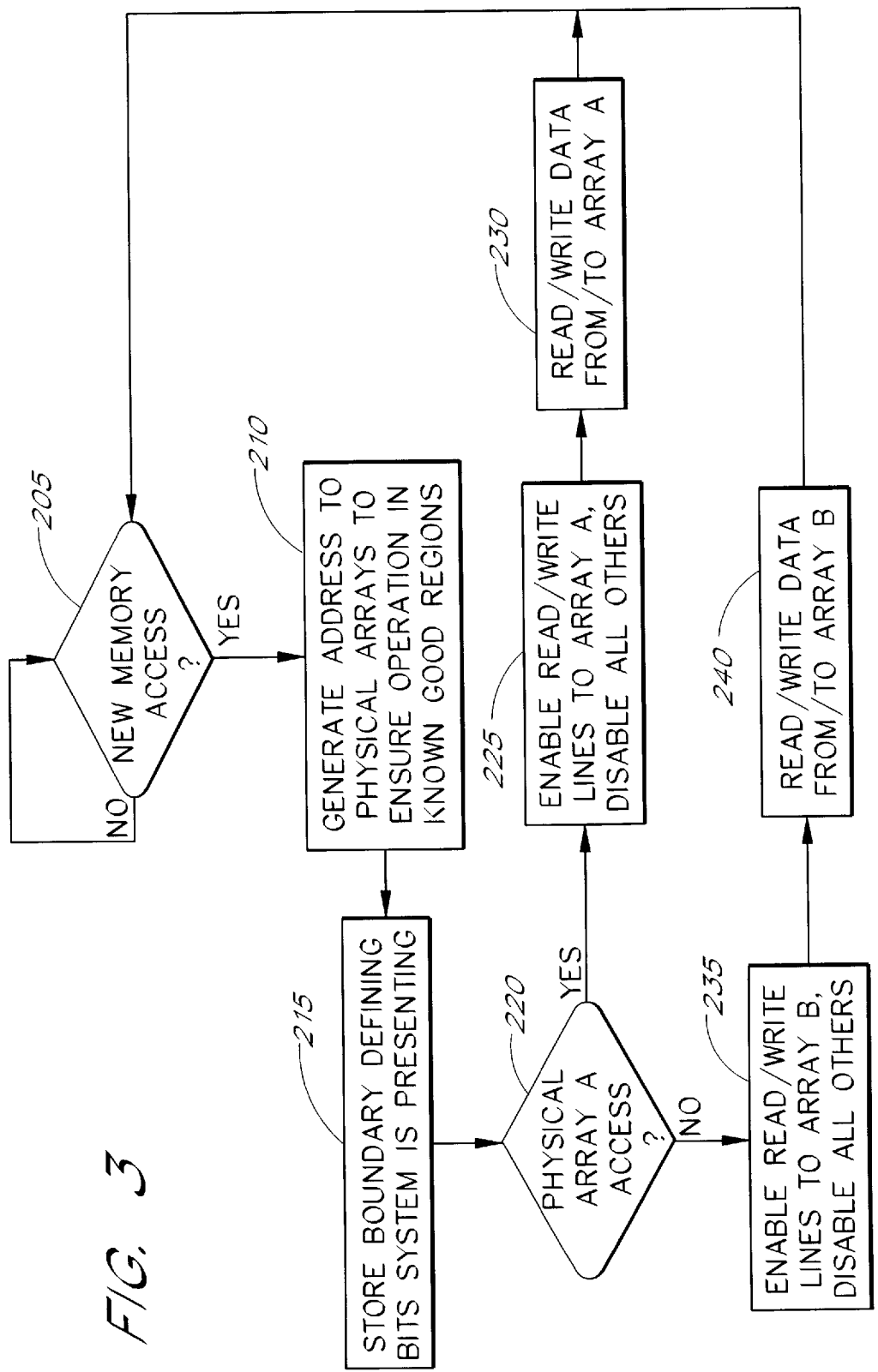
FIG. 3. is a flow chart of the steps followed in directing and redirecting data flow in the first configuration of the memory system.

FIG. 3 shows a flow chart of the steps followed in directing and redirecting data traffic in one specific decoder configuration. In this configuration, only A10 is routed through the decoder circuit 110. Because the boundary is defined by only a row address, RAS 305 and WE 327, but not CAS 310, are routed to the decoder 110. In particular, at step 205, the controller 105 sends to the decoder 110 a memory access request by placing a valid row address on the address bus 130 and driving RAS 305 low. At step 210, the decoder generates the significant bits (in this configuration A10 315) into new significant bits (in this configuration A10d 317). At step 215, the decoder 110 stores the boundary defining row address bits presented by the system (in this configuration A10 315). In effect, the logical array 170 is segmented into two sections: a top section 175 representing the physical addresses of section 150 of array A, and a bottom section 180 representing the physical addresses of section 155 of array A (whose data are stored in section 160 of memory array B). Then, applying the first example of FIG. 2 above wherein section 150 equals half of the size of memory array A 115, at step 220 the decoder 110 determines which array to enable by monitoring the logical state of the significant bit A10 315 in the data address. If the logical state of A10 is low, then the data address is between 0–1023, and the decoder enables the read/write control signals to memory array A 115 as shown in step 225. The read/write signals allow reading/writing the data from/to memory array A as indicated in step 230. If the logical state of A10 315 is high, the decoder 110 alters the state of A10 315 to low by generating the new bit A10d 317. The decoder 110 then enables the read/write control signals to memory array B 120 as shown in step 235. The read/write control signals allow reading/writing the data from/to memory array B 120 as shown in step 240. By altering the logical state of A10 to low during the row address hold time, the decoder 110 directs the data to the physical section 160 of the spare memory array B 120 having all good memory locations. Therefore, from the standpoint of the memory controller 105, the interoperability of the main and spare memory arrays 115, 120 provides a single memory having all good memory locations.

Figure 4:
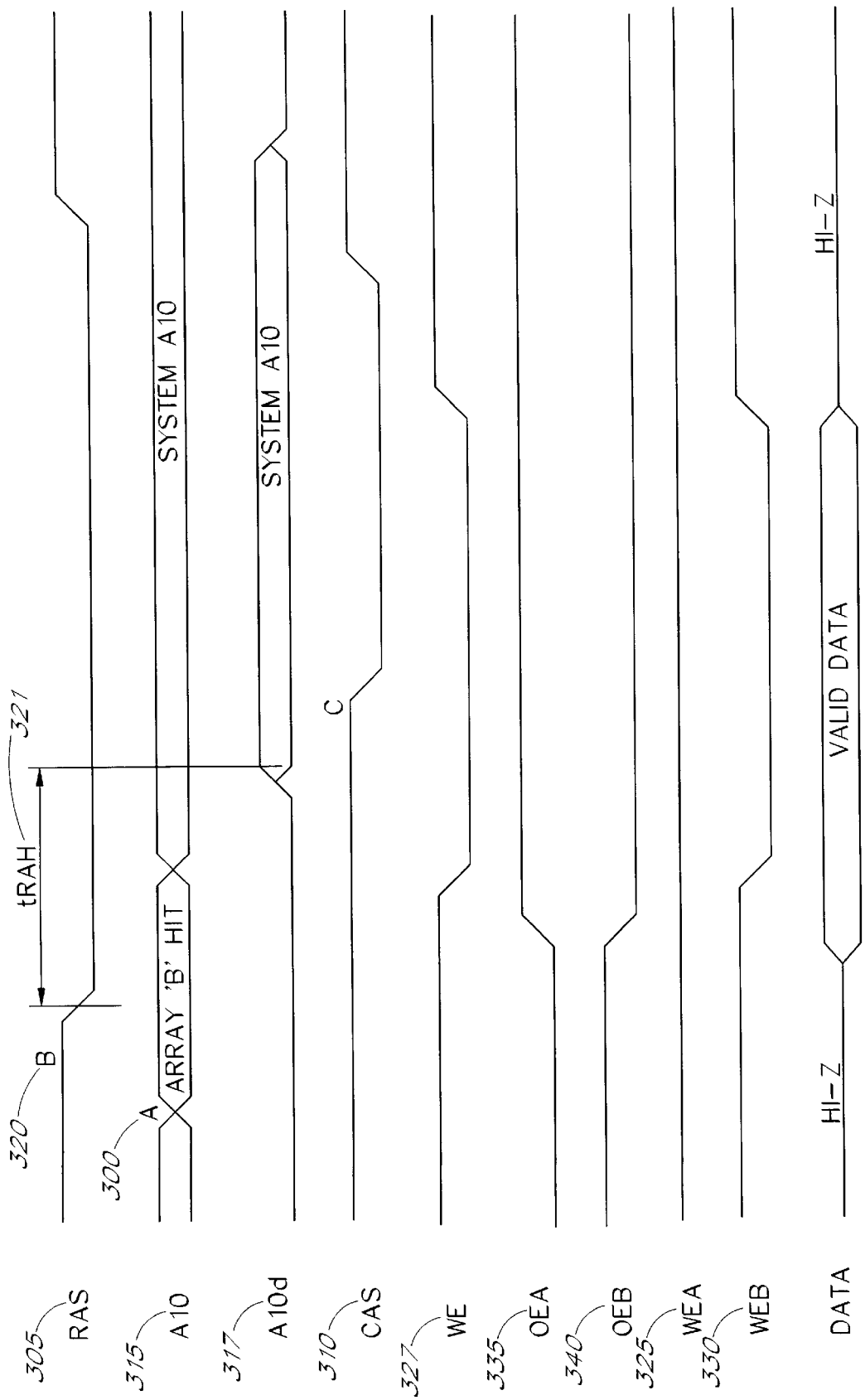
FIG. 4. is a timing diagram of a typical WRITE mode using the first configuration of the memory system.

FIG. 4 shows a timing diagram of the decoder 110 in a typical WRITE mode using the first configuration of the memory system. The timing diagram shows the logical state of memory control signals as a function of time during the WRITE mode. As is well known to those in the art, a memory cycle involves sequential row and column address presentation to the DRAM, as well as three additional signals, (1) a row address strobe ("RAS") 305, (2) a column address strobe ("CAS") 310, to access the word location in the DRAM specified by the presented row and column addresses, and (3) a write enable ("WE") 327 which when asserted configures the DRAM to store the data presented on the data bus 127 at the specified row/column address rather than retrieve the word stored at the specified row/column address. It is conventional for RAS 305, CAS 310, and WE to be active low signals. RAS 305 active transition is followed by one or more active transitions of CAS 310 for all read or write cycles.

As shown at 300 in FIG. 4, the controller 105 presents the system most significant bit A10 315 which is latched into the decoder 110 by the falling edge of RAS 305. The controller 105 also delivers to the decoder 110 a system write enable ("WE") 327, which if active at the CAS 310 active transition, indicates that data on the data bus is to be written into a memory array for storage. When performing a write cycle, the decoder 110 determines to which memory array the data is to be written. Depending on the logical state of A10 315 at 320, the decoder 110 determines whether to enable the write enable array A ("WEA") 325 or write enable array B ("WEB") 330.

In the present example, the state of A10 indicates an memory array B "hit", and therefore indicates that the data should be written to memory array B. The decoder outputs are thus configured as follows, upon initiation by the falling edge of RAS 305. For the present example, where both memory array A 115 and memory array B 120 are good in rows 0–1023, A10d must be held low during the row address hold time 321. Following this hold time, A10 from the system is passed through the decoder 110 to A10d so that the column address can be received by the memory arrays without alteration. Also upon initiation by the RAS active transition at 320, the decoder circuit 110 asserts OEB, deasserts OEA, passes WE through the decoder to the WEB 330 decoder output, and continues to hold WEA 325 high. This causes the data to be written in the section 160 of the memory array B 120 having all good memory locations. Writing to memory array A 115 is of course inhibited by the fact that WEA 325 is held in the high logical state.

Figure 5:
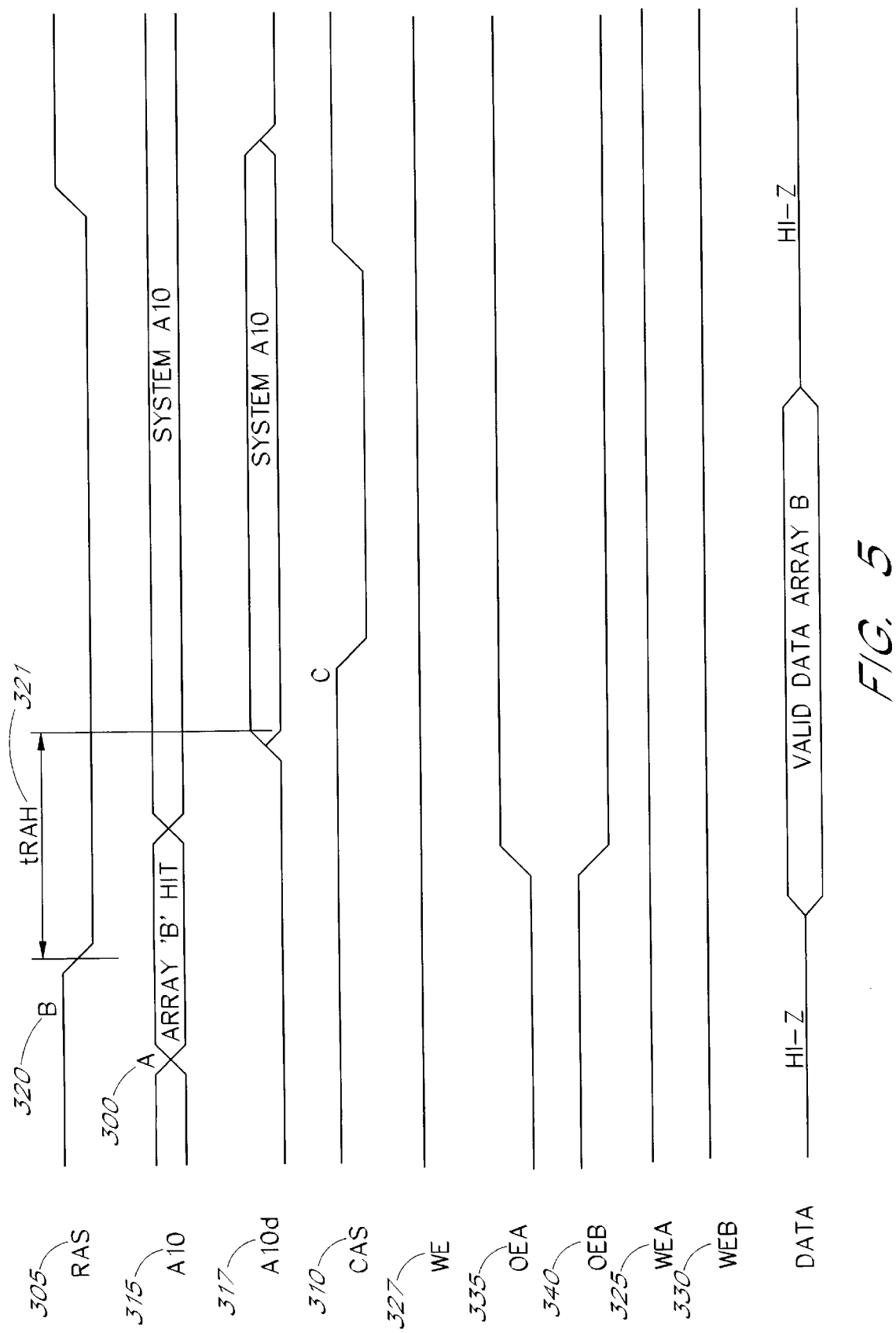
FIG. 5. is a timing diagram of a typical READ mode using the first configuration of the memory system.

FIG. 5 shows a timing diagram of a typical READ cycle using the first configuration of the memory system. As shown at 300 in FIG. 5, the controller 105 presents the system most significant row address bit A10 315 which is latched into the decoder 110 by the falling edge of RAS 305. Depending on the logical state of A10 315 at 320, the decoder 110 determines which memory array to enable, and therefore asserts either OEA 335 or OEB 340 depending on the state of A10. In the present example, as in FIG. 4, A10 indicates an memory array B "hit", and so OEB is asserted and OEA is deasserted shortly after the RAS active transition. In this example, therefore, the decoder 110 forces OEB 340 low, thereby causing the data to be read from the section of the memory array B 120 having all good memory locations. To prevent reading from the memory array A 115, OEA 335 is held in the high logical state. As with the write cycle described with reference to FIG. 4, an memory array B hit at the RAS active transition forces system WE to be passed to the WEB output, and maintains WEA in the deasserted state.

Given the versatility of the present invention, there are numerous variations to the aforementioned configuration which can be achieved by those of ordinary skill in the art. For instance, several variations may be accomplished by altering the number of memory arrays used, varying the section layout in the memory arrays, or a combination of both. For the purpose of illustration, the following is a brief description of several variations to the present configurations.

Figure 6:
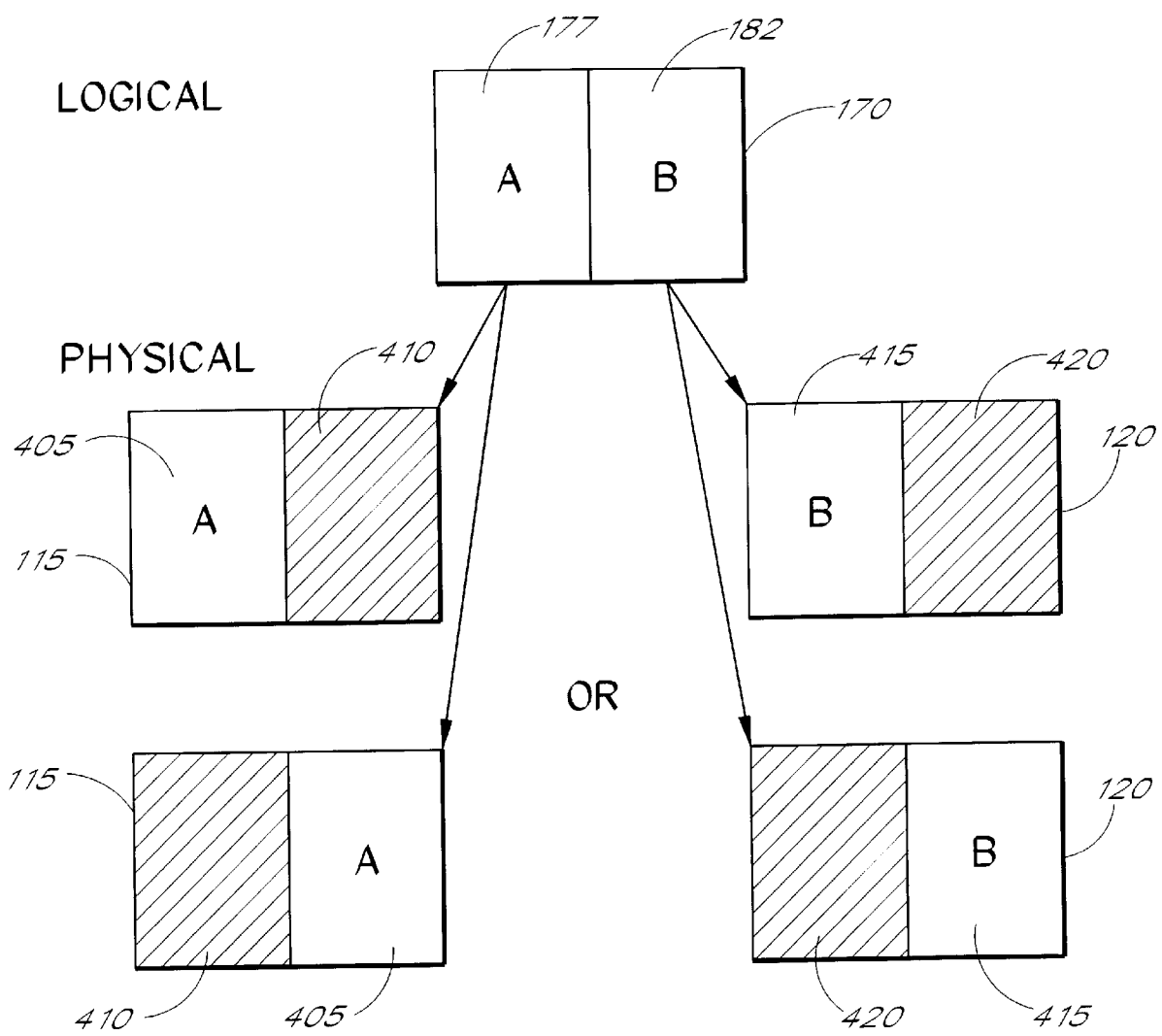
FIG. 6. is a block diagram of a first variation in the design of the first configuration with a transition from two memory arrays to one memory array.

FIG. 6 is a block diagram of a first variation in the design of the first configuration of the present invention. This variation shows a memory array design wherein the column address space comprises all good memory locations in equivalent halves of the two memory arrays A 115 and B 120. As shown in FIG. 6, the memory array A 115 is segmented into two sections. The first section is a left (or right in lower diagram) column section 405 having all good memory locations, and the second section is a right (or left) column section 410 having one or more faulty memory locations. Similarly, the memory array B 120 is segmented into two sections. The first section is a left column section 415 having all good memory locations, and the second section is a right column section 420 having one or more faulty memory locations.

As illustrated by the examples of FIG. 2 above, the decoder 110 monitors the logical state of one or more significant bits which define the boundaries separating the two sections. Depending on the logical state of the significant bits, the decoder 110 directs data signals addressed to the left section 405 of memory array A 115 to their original physical address, because section 405 contains all good memory locations. In addition, the decoder 110 redirects data signals addressed to the right section 410 of memory array A 115 to the left section 415 of memory array B, because section 410 contains one or more faulty memory locations. In effect, the decoder translates the physical address into a logical address corresponding to a logical address in the logical memory array 170 having all good memory locations. As in the first embodiment, the logical array 170 is segmented into two sections: a left section 177 representing the physical addresses of section 405 of memory array A, and a right section 182 representing the physical addresses of section 415 of memory array B. Therefore, the decoder 110 operates to allow the two memory arrays A 115 and B 120 to function as a single logical memory array 170.

It can be appreciated that when the boundary is defined by a column address, the address bits monitored and altered by the decoder 110 are column address bits rather than row address bits as described with reference to FIGS. 1 through 5 above. In the example of FIG. 6, the row address will be presented unchanged to the memory arrays, and the column address bit A10 will be latched into the decoder 110 in order to determine which memory array should be written to or read from. The same operations with respect to WEA, WEB, OEA, and OEB will then take place in a manner completely analogous to that described above, but may be initiated after a valid column address appears on the address bus, and completed prior to the falling edge of CAS. This configuration therefore requires additional attention to decoder circuit timing and to propagation delays in the decoder circuit 110.

Figure 7:
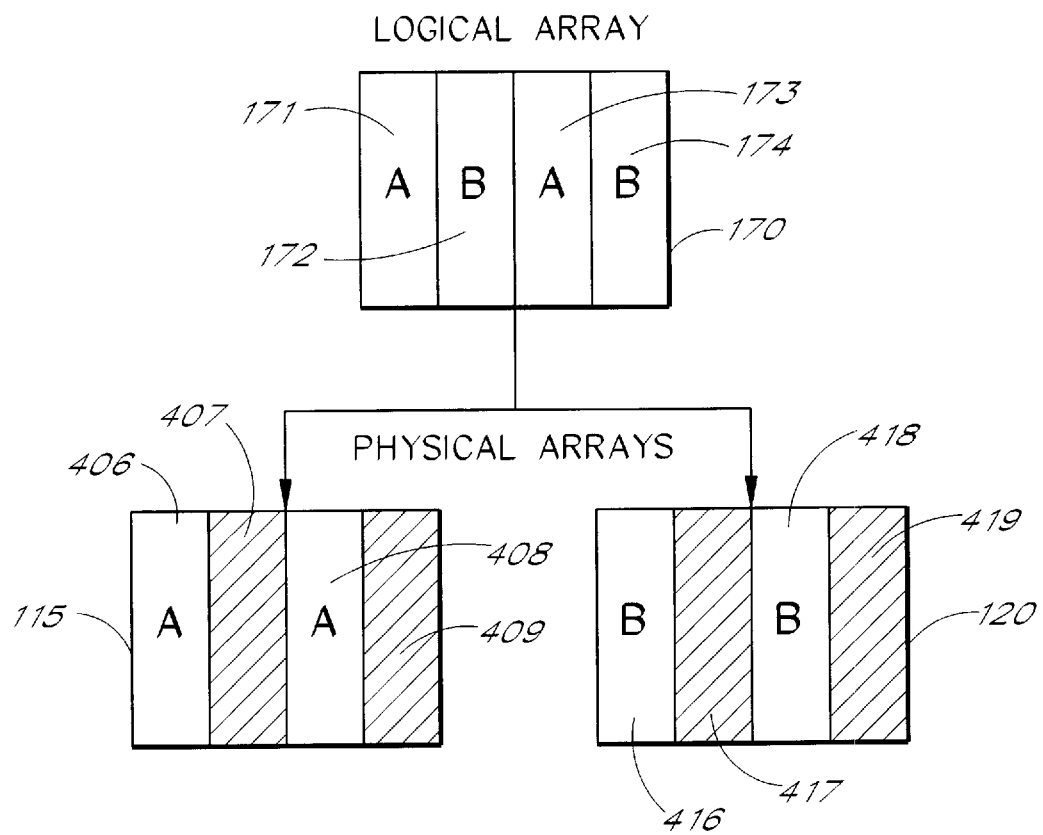
FIG. 7. is a block diagram of a second variation in the design of the first configuration with a transition from two memory arrays to one memory array.

FIG. 7 is a block diagram of a second variation in the design of the first configuration with a transition from two memory arrays to one memory array. This variation shows a memory array design wherein more than one noncontiguous good columns occur in equivalent regions in the memory arrays A 115 and B 120. As shown in FIG. 7, the memory array A 115 is segmented into four sections. The first section is a column section 406 having all good memory locations, the second section is a column section 407 having one or more faulty memory locations, the third section is a column section 408 having all good memory locations, and the fourth section is a column section 409 having one or more faulty memory locations. Similarly, the memory array B 120 is segmented into four sections. The first section is a column section 416 having all good memory locations, the second section is a column section 417 having one or more faulty memory locations, the third section is a column section 418 having all good memory locations, and the fourth section is a column section 419 having one or more faulty memory locations.

In this embodiment, the decoder 110 can be configured to monitor the logical state of bit A9 of the column address, which bit in this embodiment defines the boundaries separating the four sections. Depending on the logical state of this bit (i.e. data to and from locations having a column address with A9=0 go to memory array A and data to and from locations having a column address with A9=1 go to memory array B), the decoder 110 directs data signals addressed to sections 406 and 408 of memory array A 115 to their original physical address, because sections 406 and 408 contain all good memory locations. In addition, the decoder 110 redirects data signals addressed to sections 407 and 409 of memory array A 115 to sections 416 and 418 of memory array B respectively by asserting OEB, passing WE to WEB, and holding A9 low during the CAS active transition when the system has presented A9=1. In effect, the decoder translates the physical address into a logical address corresponding to a logical address in the logical memory array 170 having all good memory locations. Similar to previous embodiments, the logical array 170 is segmented into four sections: section 171 representing the physical addresses of section 406 of memory array A, section 172 representing the physical addresses of section 416 of memory array B, section 173 representing the physical addresses of section 408 of memory array A, and section 174 representing the physical addresses of section 418 of memory array B. Therefore, the decoder 110 operates to transition the two memory arrays A 115 and B 120 to function as a single logical memory array 170.

Figure 8:
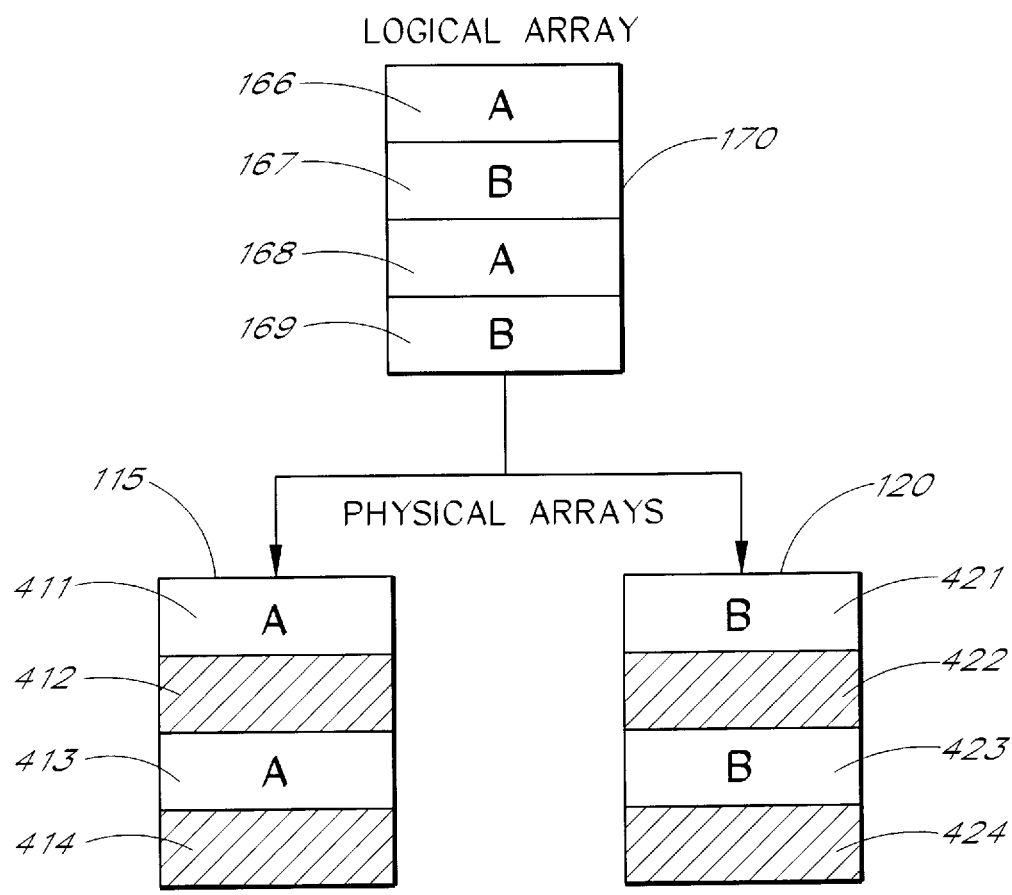
FIG. 8. is a block diagram of a third variation in the design of the first configuration with a transition from two memory arrays to one memory array.

FIG. 8 is a block diagram of a third variation in the design of the first configuration with a transition from two memory arrays to one memory array. This variation shows a memory array design wherein more than one noncontiguous good rows occur in equivalent regions in memory arrays A 115 and B 120. As shown in FIG. 8, the memory array A 115 is segmented into four sections. The first section is a row section 411 having all good memory locations, the second section is a row section 412 having one or more faulty memory locations, the third section is a row section 413 having all good memory locations, and the fourth section is a row section 414 having one or more faulty memory locations. Similarly, the memory array B 120 is segmented into four sections. The first section is a row section 421 having all good memory locations, the second section is a row section 422 having one or more faulty memory locations, the third section is a row section 423 having all good memory locations, and the fourth section is a row section 424 having one or more faulty memory locations.

In this embodiment, the decoder 110 can be configured to monitor the logical state of A9 of the row address, which bit in this embodiment defines the boundaries separating the four sections. Depending on the logical state of the significant bits, the decoder 110 directs data signals addressed to sections 411 and 413 of memory array A 115 to their original physical address, because sections 411 and 413 contain all good memory locations. In addition, the decoder 110 redirects data signals addressed to sections 412 and 414 of memory array A 115 to sections 421 and 423 of memory array B respectively, because sections 412 and 414 contain faulty memory locations. In effect, the decoder translates the physical address into a logical address corresponding to a logical address in the logical memory array 170 having all good memory locations. Similar to previous embodiments, the logical array 170 is segmented into four sections: section 166 representing the physical addresses of section 411 of memory array A, section 167 representing the physical addresses of section 421 of memory array B, section 168 representing the physical addresses of section 413 of memory array A, and section 169 representing the physical addresses of section 423 of memory array B. Therefore, the decoder 110 operates to allow the two memory arrays A 115 and B 120 to function as a single logical memory array 170. Decoder operation in the memory array configuration of FIG. 8 will be identical to that illustrated in FIGS. 1 through 5, with the exception that bit A9 of the row address is substituted for bit A10 of the row address.

Figure 9:
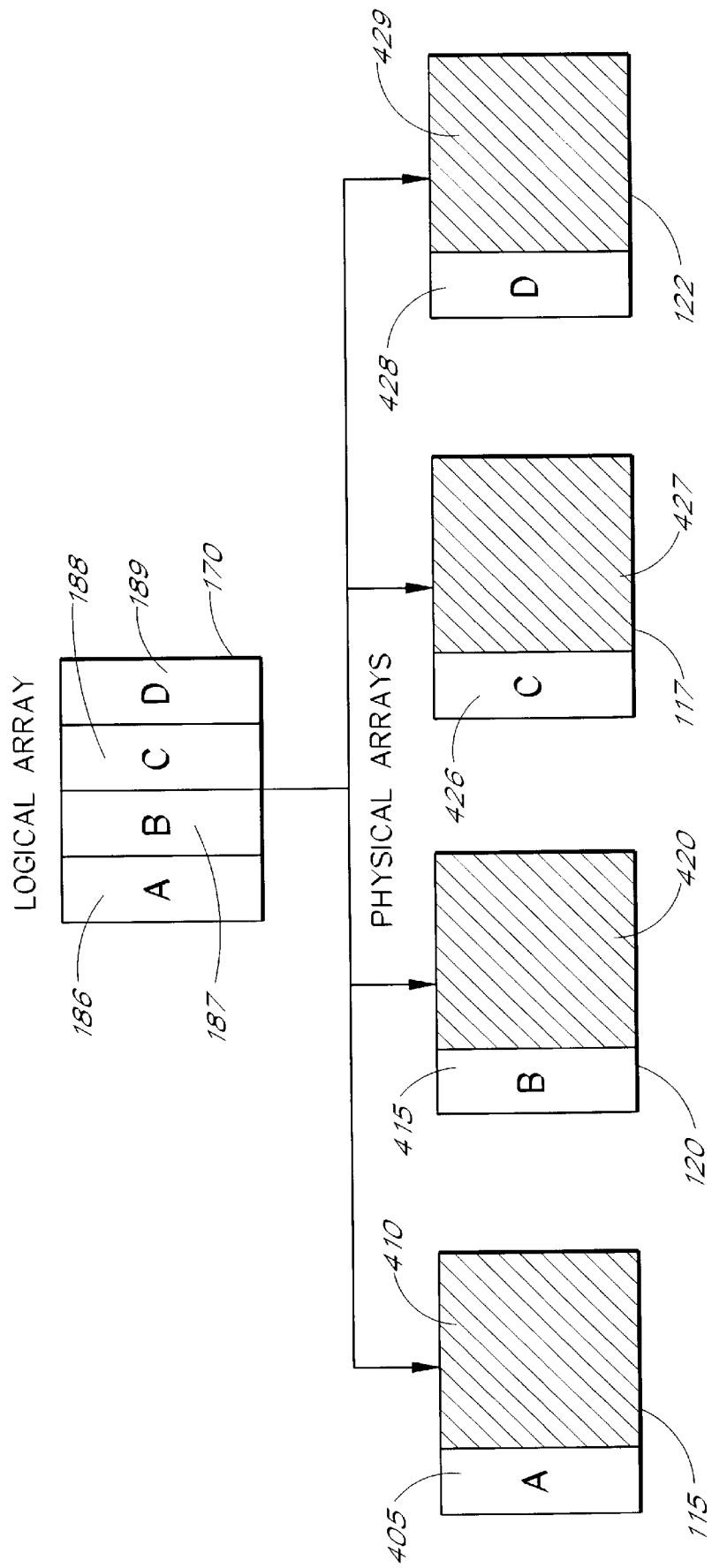
FIG. 9. is a block diagram of a fourth variation in the design of the first configuration with a transition from four memory arrays to one memory array.

FIG. 9 is a block diagram of a fourth variation in the design of the first configuration with a transition from four memory arrays to one memory array. This variation shows a memory array design wherein sections of good columns occur in equivalent regions in the memory arrays A 115, B 120, and additional memory arrays C 117 and D 122 having faulty memory locations. As shown in FIG. 9, the memory array A 115 is segmented into two sections. The first section is a column section 405 having all good memory locations, and the second section is a column section 410 having one or more faulty memory locations. Similarly, the memory array B 120 is segmented into two sections. The first section is a column section 415 having all good memory locations, and the second section is a column section 420 having one or more faulty memory locations. The memory array C 117 is segmented into two sections. The first section is a column section 426 having all good memory locations, and the second section is a column section 427 having one or more faulty memory locations. Finally, the memory array D 122 is segmented into two sections. The first section is a column section 428 having all good memory locations, and the second section is a column section 429 having one or more faulty memory locations.

If in this embodiment, the good column address space of each memory array is the lower one quarter the 2048 columns, the decoder 110 will preferably monitor the logical state of bits A9 and A10 of the column address. It can be appreciated that the column address presented to the memory arrays during reads and writes should then always have 00 as bits A10 and A9 of the column address. Furthermore, the decoder 110 of this embodiment will include OEC and OED output signals, as well as WEC and WED outputs. In a manner analogous to that described with respect to the above embodiments, the decoder 110 directs data signals addressed to section 405 of memory array A 115 to their original physical address, because section 405 contains all good memory locations. In addition, the decoder 110 redirects data signals addressed to sections 410 of memory array A 115 to sections 415 of memory array B 120, 426 of memory array C 117, and 428 of memory array D depending on their address range, because section 410 contains one or more faulty memory locations. For example, if the system presents a column address having "11" as high order bits A10 and A9, the decoder will preferably assert OED, pass WE to WED, and hold A9 and A10 low during the CAS active transition. This will force reads and writes to this range of presented column addresses to the lower quarter of the column address range of memory array D. In effect, the decoder translates the physical address into a logical address corresponding to a logical address in the logical memory array 170 having all good memory locations. Similar to previous embodiments, the logical array 170 is segmented into four sections: section 186 representing the physical addresses of section 405 of memory array A, section 187 representing the physical addresses of section 415 of memory array B, section 188 representing the physical addresses of section 426 of memory array C, and section 189 representing the physical addresses of section 428 of memory array D. Therefore, the decoder 110 operates to allow the four memory arrays A 115, B 120, C 117, and D 122 to function as a single logical memory array 170.

Figure 10:
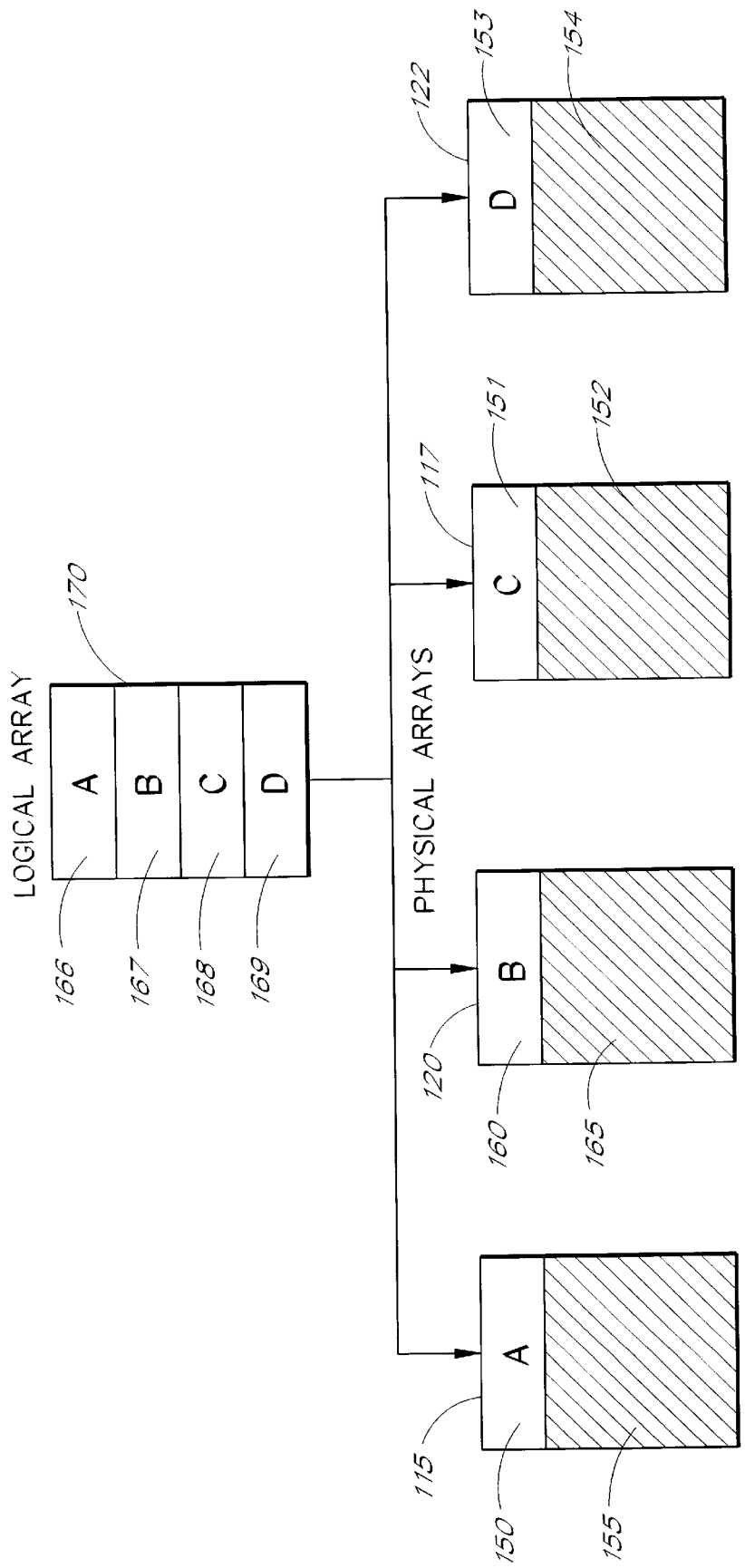
FIG. 10. is a block diagram of a fifth variation in the design of the first configuration with a transition from four memory arrays to one memory array.

FIG. 10 is a block diagram of a fifth variation in the design of the first configuration with a transition from four memory arrays to one memory array. This variation shows a memory array design wherein sections of good rows occur in equivalent regions in the memory arrays A 115, B 120, and additional memory arrays C 117 and D 122 having faulty memory locations. As shown in FIG. 10, the memory array A 115 is segmented into two sections. The first section is a row section 150 having all good memory locations, and the second section is a row section 155 having one or more faulty memory locations. Similarly, the memory array B 120 is segmented into two sections. The first section is a row section 160 having all good memory locations, and the second section is a row section 165 having one or more faulty memory locations. The memory array C 117 is segmented into two sections. The first section is a row section 151 having all good memory locations, and the second section is a row section 152 having one or more faulty memory locations. Finally, the memory array D 122 is segmented into two sections. The first section is a row section 153 having all good memory locations, and the second section is a row section 154 having one or more faulty memory locations. The preferable decoder circuit corresponding to this memory array configuration will behave in a manner similar to that described with respect to FIG. 9, but row address bits A9 and A10 will be utilized rather than column address bits A9 and A10.

Figure 11:
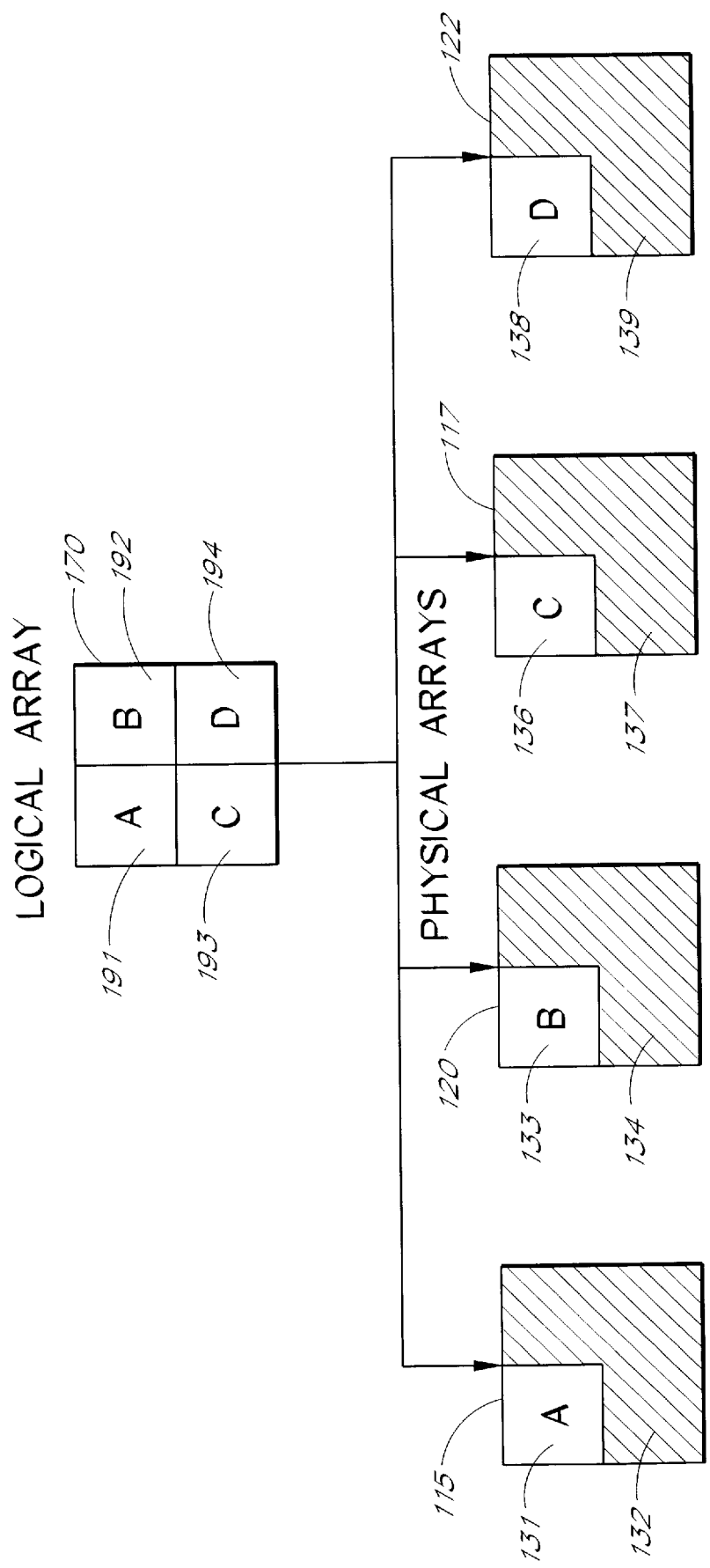
FIG. 11. is a block diagram of a sixth variation in the design of the first configuration with a transition from four memory arrays to one memory array.

FIG. 11 is a block diagram of a sixth variation in the design of the first configuration with a transition from four memory arrays to one memory array. This variation shows a memory array design wherein sections with boundaries on both good rows and columns occur in equivalent regions in the memory arrays A 115, B 120, and additional memory arrays C 117 and D 122 having faulty memory locations. As shown in FIG. 11, the memory array A 115 is segmented into two sections. The first section is a row-column section 131 having all good memory locations, and the second section is a row-column section 132 having one or more faulty memory locations. Similarly, the memory array B 120 is segmented into two sections. The first section is a row-column section 133 having all good memory locations, and the second section is a row-column section 134 having one or more faulty memory locations. The memory array C 117 is segmented into two sections. The first section is a row-column section 136 having all good memory locations, and the second section is a row-column section 137 having one or more faulty memory locations. Finally, the memory array D 122 is segmented into two sections. The first section is a row-column section 138 having all good memory locations, and the second section is a column section 139 having one or more faulty memory locations.

Once again, operation of the decoder with these memory arrays is similar to that set forth in the other examples above. In this embodiment, however, bits from both the row and column addresses will be monitored to direct data flow to and from the proper memory arrays. In this example, if each array is all good for the lower half of both the row and column address space, bit A10 for both row and column addresses will be monitored. In some aspects, the embodiment of FIG. 11 is especially advantageous, because the address terminal A10 of the DRAMs could be tied permanently to ground, as no memory array can be addressed at locations where A10 of either the row or column address is 1. For this embodiment, therefore, no address line output of the decoder is necessary.

As a specific example, therefore, the decoder could advantageously be configured to internally store bit A10 of the presented row address at the RAS active transition. When the controller 105 presents the column address, bit A10 of the column address will also be stored internal to the decoder 110. Prior to the next assertion of CAS, demultiplexers in the decoder will assert OEA and pass WE to WEA if the A10 bits of both the row and column addresses are 0. If bit A10 of the row address is zero, and bit A10 of the column address is 1, then the decoder will assert OEB, and pass WE to WEB. Memory array C 117 and memory array D 122 may be selected in a similar manner for row and column A10 bits of 10 and 11 respectively.

Figure 12:
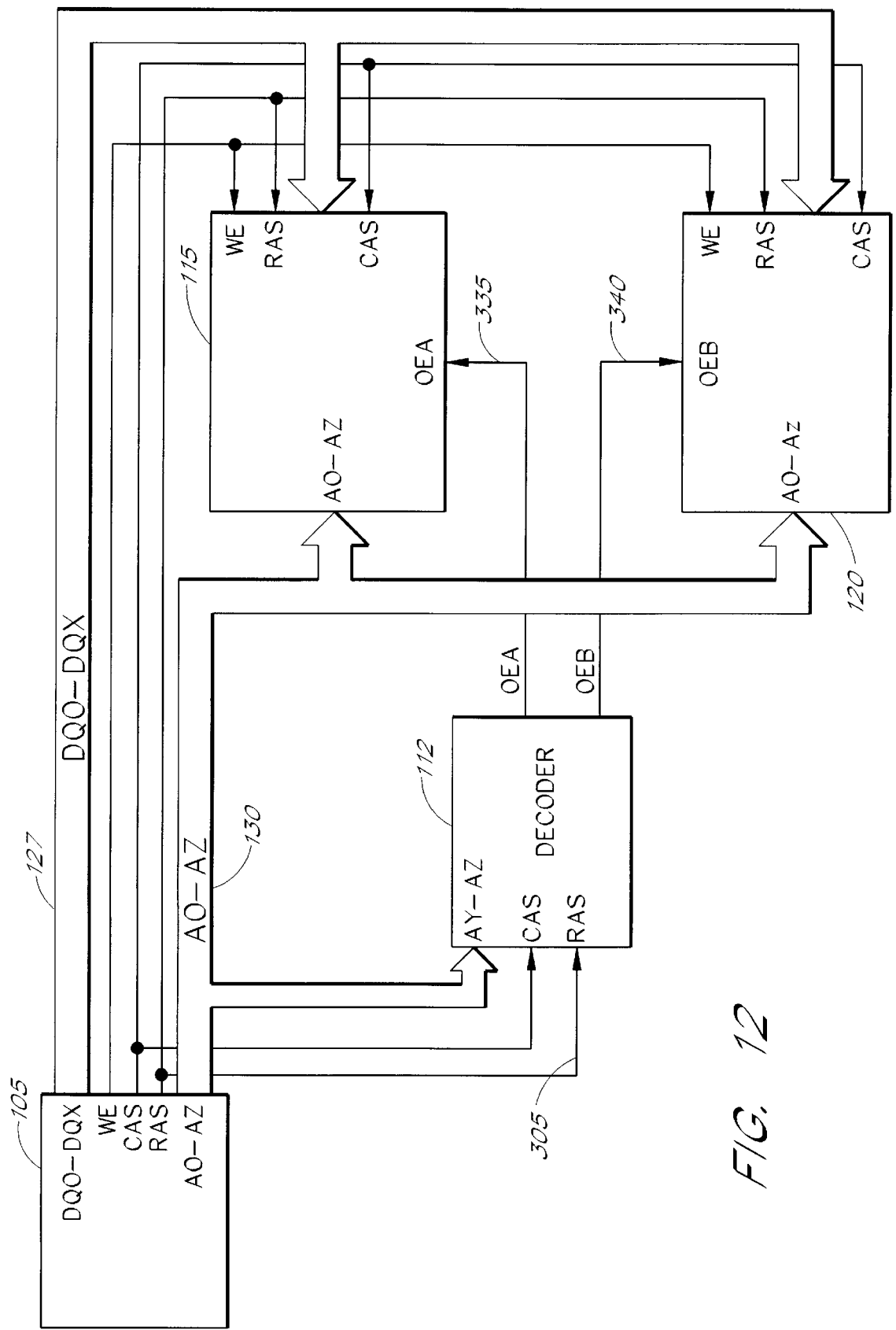
FIG. 12. is a system block diagram of an exemplary memory system for a second configuration of the memory system.

In a second configuration of the present invention, a further simplified design is implemented to manage faulty memory locations. In particular, a system block diagram of a preferred second configuration of the memory system is depicted in FIG. 12. This embodiment is advantageous when DRAMs being incorporated into a memory module 125 include regions of all good memory locations which occur in complementary areas of the row and column address space. In this case, boundaries can be defined which allow each DRAM of the module to use unmodified system presented addresses, thereby eliminating the need to include an address output from the decoder. Furthermore, decoder 110 involvement in write cycles can be completely avoided.

Referring now to FIG. 12, the system comprises a memory controller 105, a simplified decoder 112, a main memory array A 115, and a spare memory array B 120. In contrast to the FIG. 1 embodiment discussed above, however, significant address lines 315 which define boundaries inside each memory array are not routed through the decoder 112, but are only split off so as to provide decoder inputs for memory management. The complete address bus, delivering addresses as presented by the controller, is connected to the address lines of the DRAMs as would be the case in a conventional memory module.

The embodiment of FIG. 12 is similar in several ways to the embodiment of FIG. 1. For example, the RAS 305 and CAS 310 signals are routed as inputs to both the decoder 112 and the DRAM memory arrays A 115 and B 120. In addition, one or more of the lines of the address bus 130 are separated out on the memory module 125 and routed to (but not through) the decoder circuit 112. As before, in many applications, only the highest order address bit is routed to the decoder, although in some embodiments the two or three highest order bits are separated out and run to the decoder 110. As will be explained below, which address lines are routed to the decoder will depend on the nature of memory arrays A and B, and may in general comprise any subset or all of the address lines A0–AZ.

In contrast with the embodiment illustrated in FIG. 1, however, the WE 327 from the controller is not routed as an input to the decoder 112 but is connected to the module 125 DRAM memory arrays A 115 or B 120 as in a conventional memory module. Further in contrast to the FIG. 1 embodiment, in this simplified decoder 112, the only outputs comprise an OE signal for each memory array such as OEA for memory array A 115 and OEB for memory array B 120 illustrated in FIG. 12.

Figure 13:
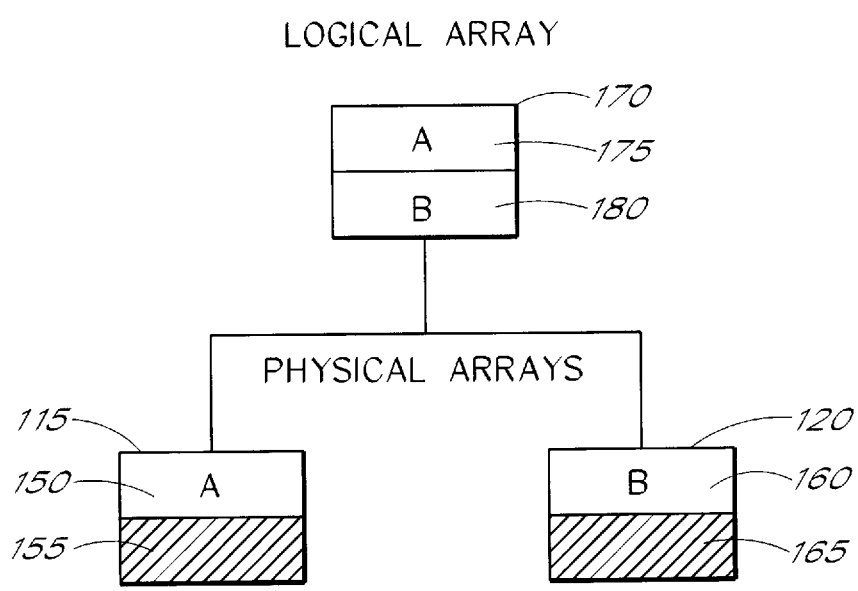
FIG. 13. is a block diagram of an exemplary transition from two memory arrays to one memory array.

The decoder 112 of the memory system manages the data flow through the two memory arrays A 115 and B 120, so that the two memory arrays appear to the controller 105 as a single memory having all good memory locations. A block diagram of an exemplary transition from two memory arrays A 115 and B 120 having faulty memory locations into a single memory array having all good memory locations is shown in FIG. 13. As shown in FIG. 13, memory array A 115 is segmented into two physical sections. The top section 150 contains rows having all good memory locations, whereas the bottom section 155 contains rows having one or more faulty memory locations. Similarly, memory array B 120 is segmented into two physical sections. The top section 160 contains rows having one or more faulty memory locations, whereas the bottom section 165 contains rows having all good memory locations. In the present embodiment, section 155 of memory array A 115 having one or more faulty memory locations overlays the section 165 of memory array B 120 having all good memory locations. In view of the segmentation of the memory arrays, one or more good memory locations may not be used. However, irrespective of the layout of the physical sections having all good memory locations, the sum of the usable memory locations preferably equals or exceed the sum of the memory locations of the logical memory array 170 having all good memory locations.

Using the same specific example as used in the discussion above, each physical memory array may comprise a DRAM having 4M×4 bits per addressable word. If section 150 equals half of the size of the memory array A 115, then the physical section 150 of the main memory array A 115 having all good memory locations would be described by the row address range of decimal 0–1023, defined by the 10 low order bits A0–A9 of the available row address space. Whereas, the physical section 155 of the main memory array A 115 having one or more faulty memory locations would be described by a row address range of decimal 1024–2047. In this embodiment, memory array B 120 has good/faulty regions in a complementary area with respect to memory array A 115. Specifically, memory array B has an all good memory region 165 at row addresses decimal 1024–2047, and one or more faulty memory locations at row addresses 0–1023.

Similar to the discussion accompanying FIG. 2 above, the logical state of the row address bit A10 determines to which physical section data is retrieved from. However, data retrieval will be performed correctly at all system presented row addresses if the decoder asserts OEA 335 when it receives a row address bit A10 of 0, and asserts OEB 340 when it receives a row address bit A10 of 1. It can be appreciated that due to the complementary nature of the all good regions of the memory arrays A and B, no address output of the decoder need be provided to ensure that data is retrieved only from the all good memory regions of the memory arrays.

Moreover, if it is assumed that section 150 is one-fourth the size of the memory array A 115, and section 165 of memory array B 120 is three-fourths the size of the memory array B 120, then the decoder will include both A9 and A10 of the address lines as inputs, and will assure proper data retrieval by asserting OEA 335 when both A9 and A10 are 0 at the RAS active transition, and assert OEB if either A9 or A10 is 1 at the RAS active transition.

Furthermore, the decoder is not involved in system writes in any way. During a write, the system will write data to both memory array A and memory array B to the same location at the same time. Although one copy may be faulty, the decoder ensures that during a subsequent read access to that memory location, the data retrieved is from the memory array known to have that memory location in its all good region. It can be appreciated that numerous variations of memory arrays having complementary all good regions analogous to that illustrated in FIG. 13 can be implemented to function as a single memory array as long as the sum of the usable good memory locations in the memory arrays equals or exceeds the sum of the memory locations of a single memory array having all good memory locations.

Figure 14:
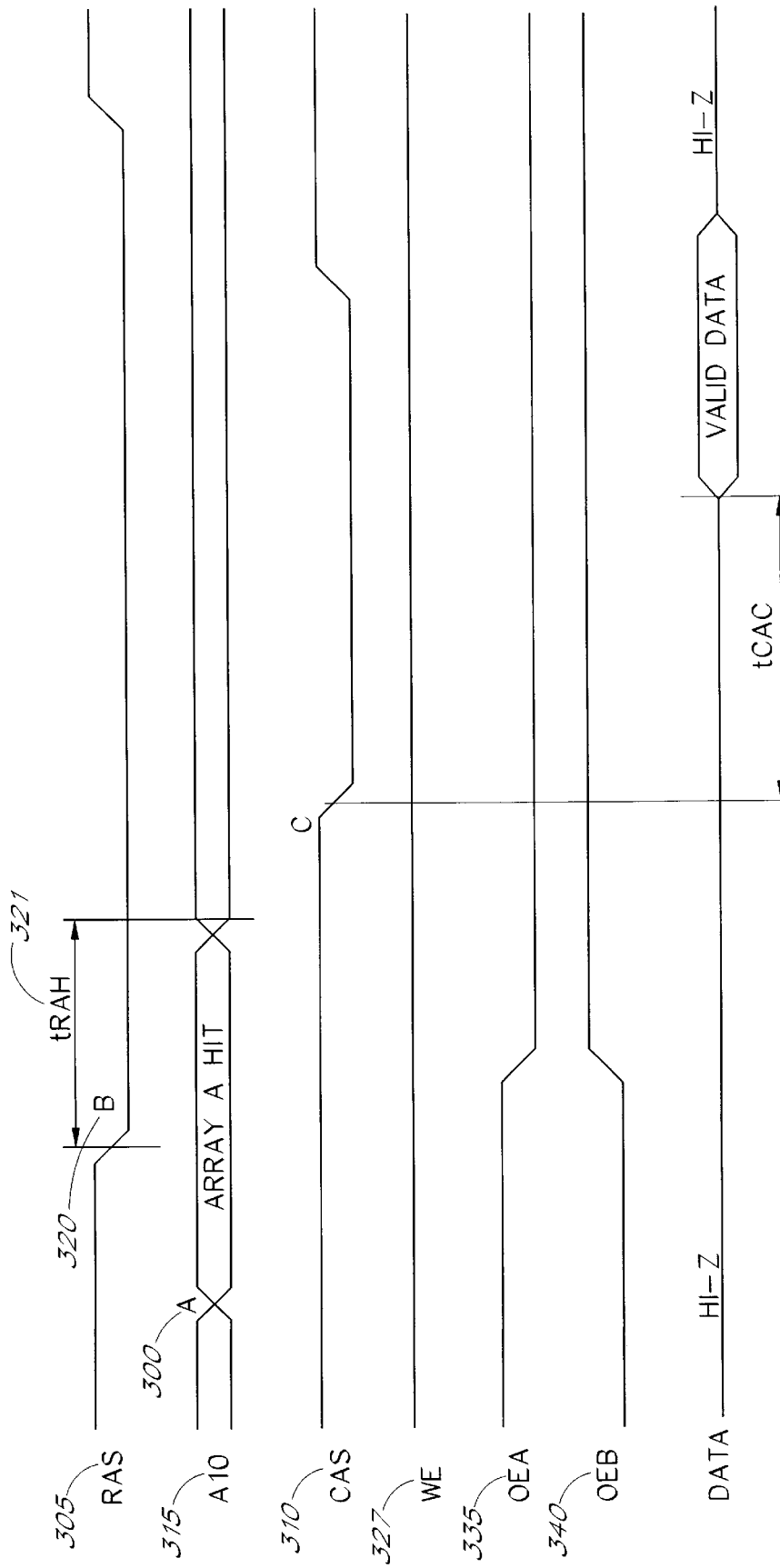
FIG. 14. is a timing diagram of a typical READ mode using the second configuration of the memory system.

FIG. 14 shows a timing diagram of a typical READ mode using the second configuration of the memory system when the DRAM memory arrays have memory region boundaries as illustrated in FIG. 13. As shown at 300 in FIG. 14, the controller 105 provides the decoder 112 (and the DRAM memory arrays) with the high order address bit A10 315, and this is latched into the decoder and the DRAMs by the falling edge of RAS 305. As has also been described above, when A10 315 is the significant bit defining the boundary between the two physical sections, then depending on the logical state of A10 315 at 320, the decoder 112 determines which memory array to enable with the transmission of a specific output enable signal, i.e., either the OEA 335 or OEB 340 decoder 112 outputs. In this example, A10 315 presented by the system is 0 at the RAS active transition, and the decoder 112 therefore forces OEA 335 to the low state, thereby causing the data to be read from the section 150 of the memory array A 115 which has all good memory locations. To prevent reading from the memory array B 120, OEB 340 is held in the high logical state.

Figure 15:
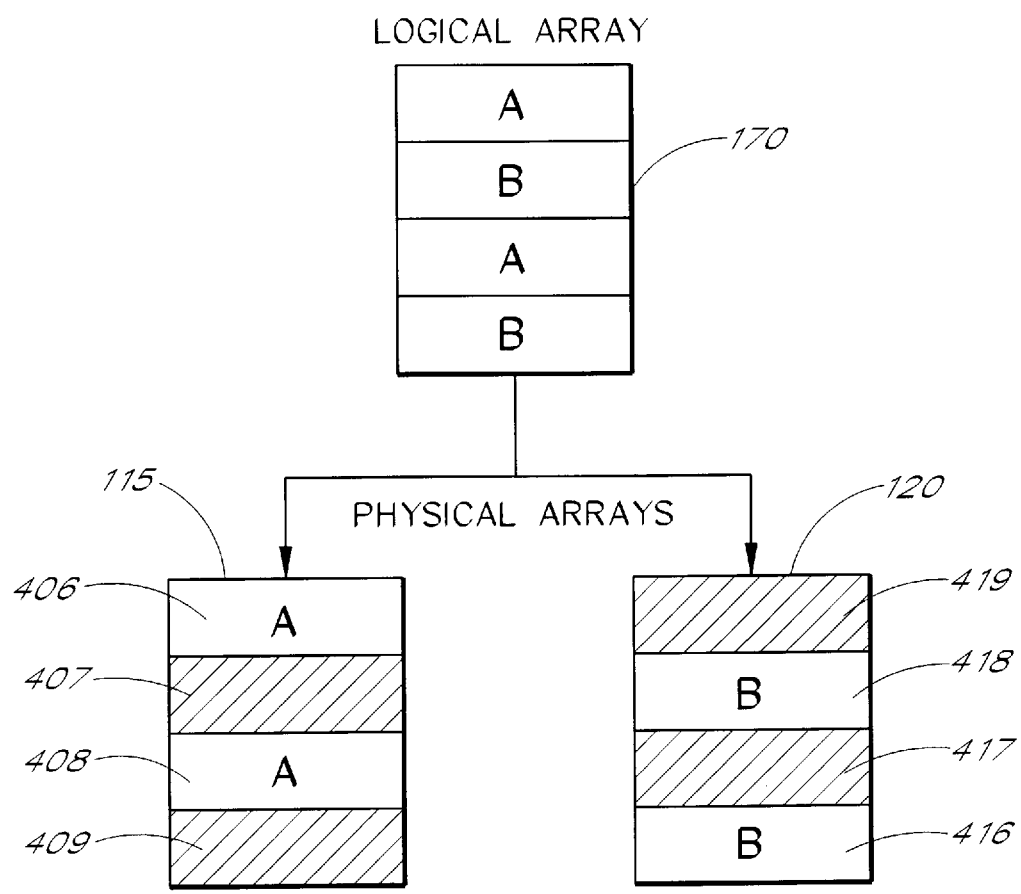
FIG. 15. is a block diagram of a first variation in the design of the second configuration with a transition from two memory arrays to one memory array.
Figure 18:
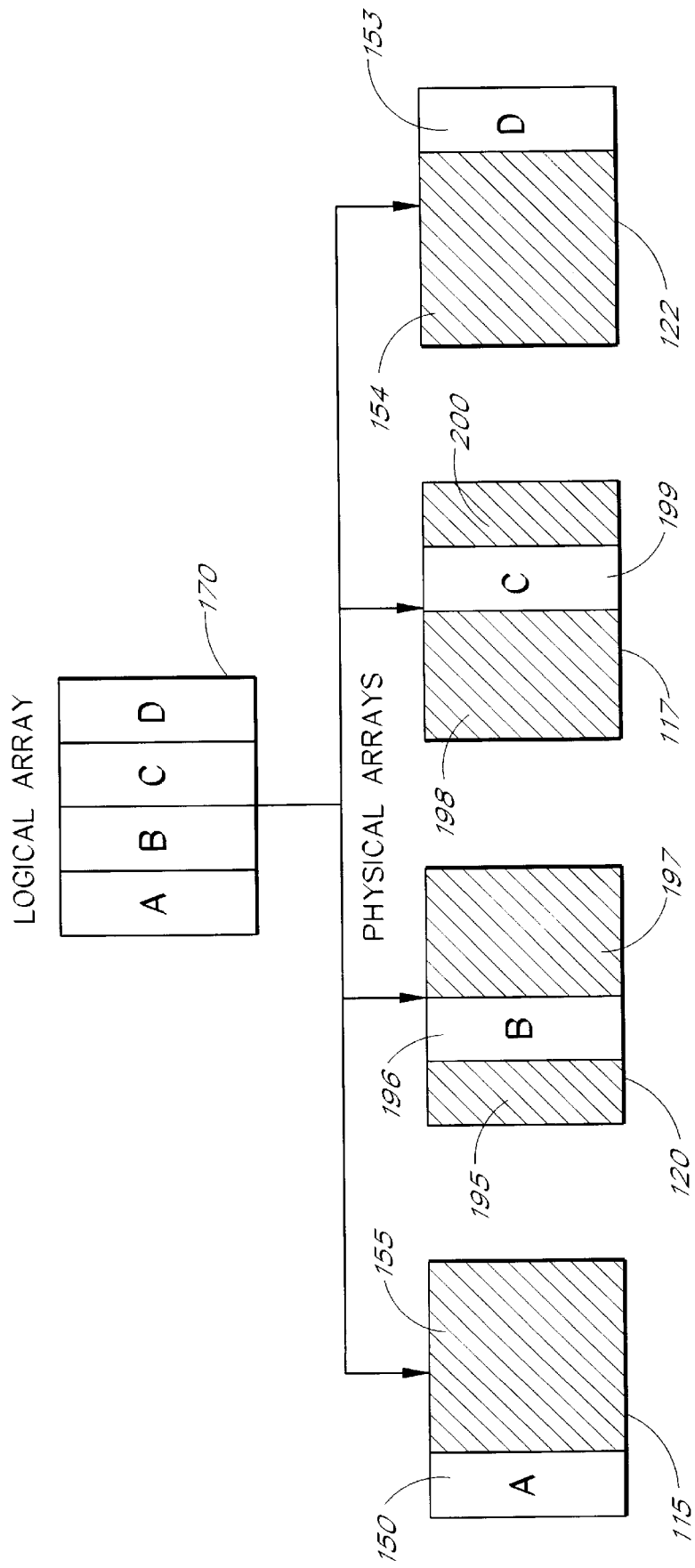
FIG. 18. is a block diagram of a fourth variation in the design of the second configuration with a transition from four memory arrays to one memory array.

FIG. 15 is a block diagram of a first variation in the design of the second configuration with a transition from two memory arrays to one memory array. This variation shows a memory array design wherein more than one noncontiguous good rows occur in complementary regions in the memory arrays A 115 and B 120. As shown in FIG. 18, memory array A 115 is segmented into four physical sections. The first section 406 contains rows having all good memory locations, the second section 407 contains rows having one or more faulty memory locations, the third section 408 contains rows having all good memory locations, and the fourth section 409 contains rows having one or more faulty memory locations. Similarly, memory array B 120 is segmented into four physical sections. The first section 419 contains rows having one or more faulty memory locations, the second section 418 contains rows having all good memory locations, the third section 417 contains rows having one or more faulty memory locations, and the fourth section 416 contains rows having all good memory locations.

In the present embodiment, sections 407 and 409 of memory array A 115 having one or more faulty memory locations overlays sections 418 and 416 of memory array B 120 having all good memory locations. The size of these sections can vary as long as sections 406 and 408 overlay sections 419 and 417 respectively. The sum of the good memory locations in the memory arrays A 115 and B 120 preferably at least equals the sum of the memory locations of a single memory array having all good memory locations. In view of the segmentation of the memory arrays, one or more good memory locations may not be used. However, the sum of the usable memory locations may equal or exceed the sum of the memory locations of a logical memory array 170 having all good memory locations. Therefore, by enabling data storage in both memory arrays A 115 and B 120 simultaneously, and data retrieval from sections 406, 418, 408, and 416 only, the decoder 112 operates to allow the two memory arrays A 115 and B 120 to function as a single logical memory array 170. As a specific example of the embodiment of FIG. 15, memory array A 115 has all good memory locations at row addresses 0–511 and 1024–1535, and some bad memory locations in the remaining row address space. Memory array B has all good memory locations at row addresses 512–1023, and 1536–2047, and some bad memory locations in the remaining row address space. In this configuration, it can be appreciated that the decoder 112 will operate identically to that described with reference to FIGS. 12–14, with the exception that bit A9 is substituted for A10.

Figure 16:
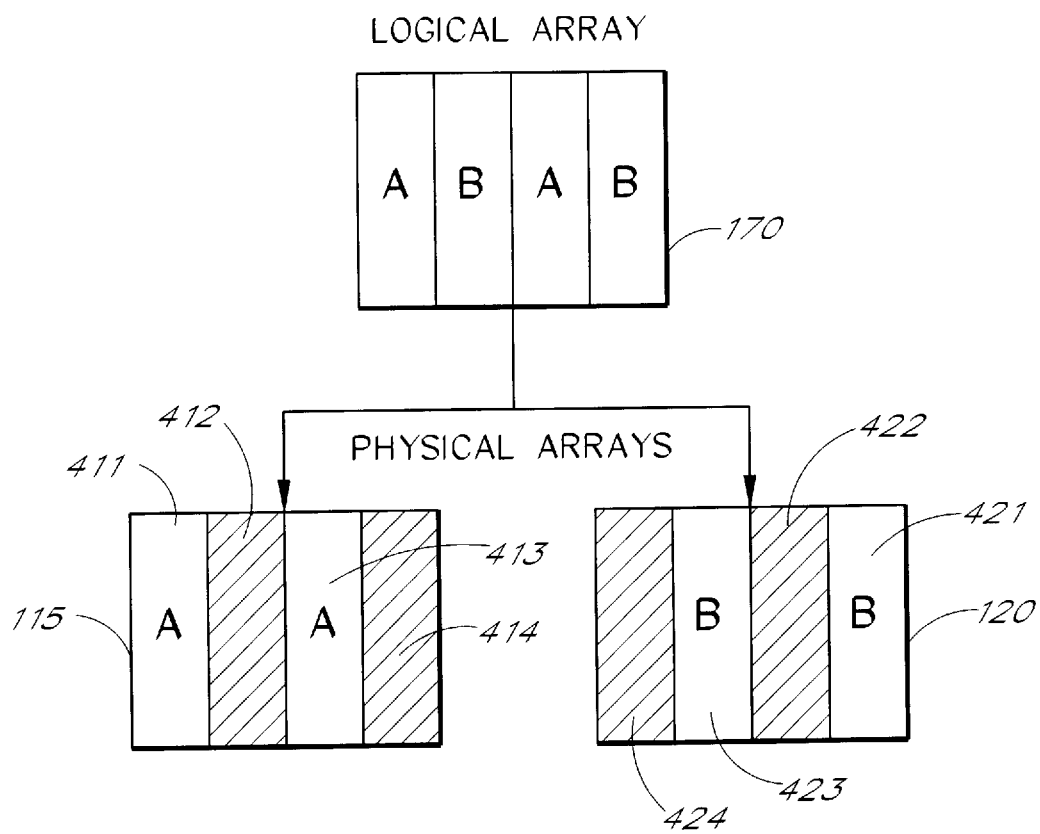
FIG. 16. is a block diagram of a second variation in the design of the second configuration with a transition from two memory arrays to one memory array.

FIG. 16 is a block diagram of a second variation in the design of the second configuration with a transition from two physical memory arrays to one logical memory array. This variation shows a memory array design wherein more than one noncontiguous good columns occur in complementary regions in the memory arrays A 115 and B 120. As shown in FIG. 16, memory array A 115 is segmented into four physical sections. The first section 411 contains columns having all good memory locations, the second section 412 contains columns having one or more faulty memory locations, the third section 413 contains columns having all good memory locations, and the fourth section 414 contains columns having one or more faulty memory locations. Similarly, memory array B 120 is segmented into four physical sections. The first section 424 contains columns having one or more faulty memory locations, the second section 423 contains columns having all good memory locations, the third section 424 contains columns having one or more faulty memory locations, and the fourth section 425 contains columns having all good memory locations. In the present embodiment, sections 412 and 414 of memory array A 115 having one or more faulty memory locations overlays sections 423 and 421 of memory array B 120 having one or more faulty memory locations. The size of these sections can vary as long as sections 412 and 414 overlay sections 423 and 421 respectively. The sum of the good memory locations in the memory arrays A 115 and B 120 at least equals the sum of the memory locations of a single memory array having all good memory locations. In view of the segmentation of the memory arrays, one or more good memory locations may not be used. Consequently, the sum of the usable memory locations may equal or exceed the sum of the memory locations of a logical memory array 170 having all good memory locations. Therefore, by enabling data storage in both memory arrays A 115 and B 120 simultaneously, and data retrieval from sections 411, 423, 413, and 421 only, the decoder 112 operates to transition the two memory arrays A 115 and B 120 to function as a single logical memory array 170. Of course, if DRAMs having all good memory regions in accordance with FIG. 16 are incorporated onto a memory module, the decoder receives address bit A9 and CAS as inputs, rather than address bit A9 and RAS.

Figure 17:
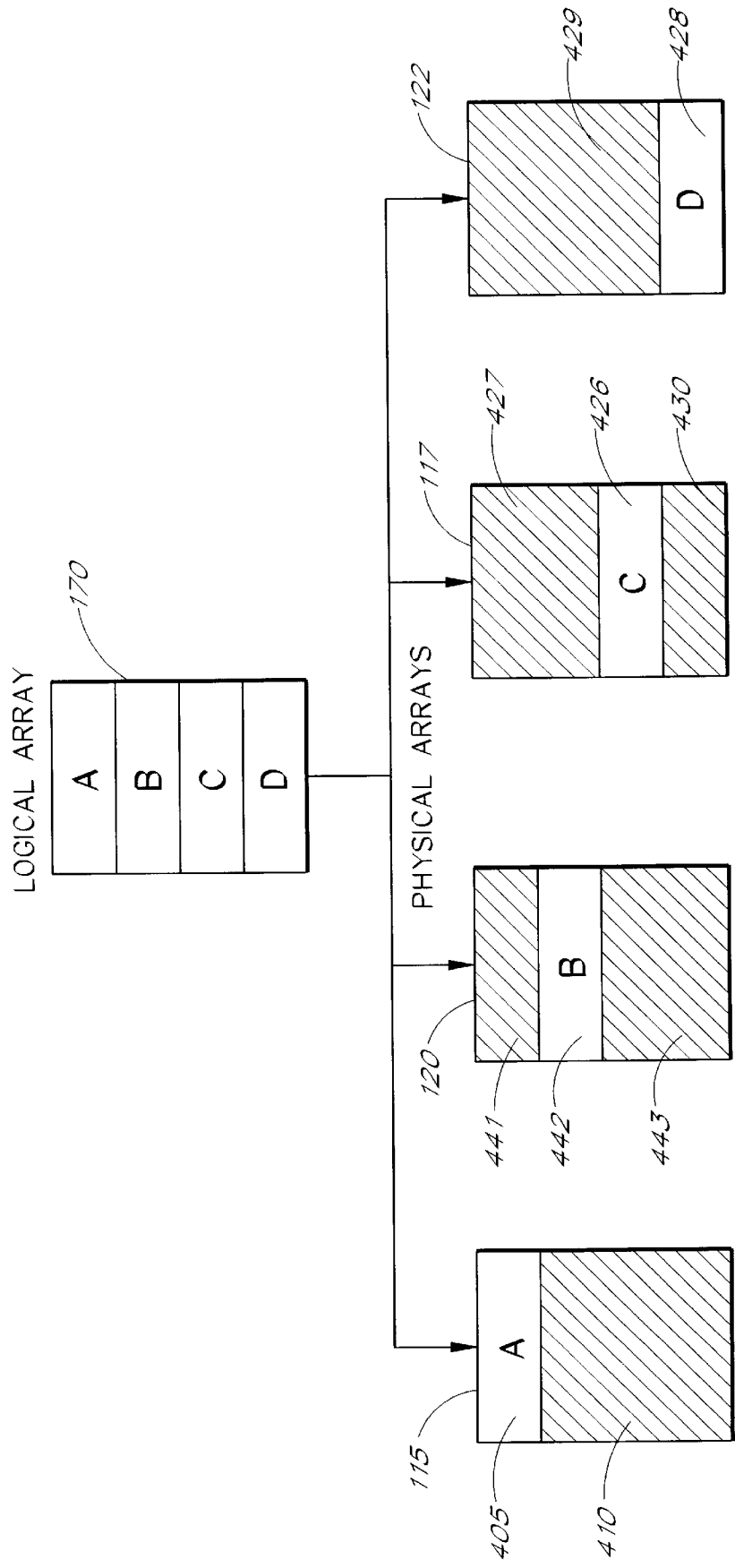
FIG. 17. is a block diagram of a third variation in the design of the second configuration with a transition from four memory arrays to one memory array.

FIG. 17 is a block diagram of a third variation of DRAM memory arrays which may advantageously be utilized with the second configuration of the decoder 112 having a transition from four memory arrays to one memory array. This variation shows a memory array design wherein sections of good rows occur in complementary regions in the memory arrays A 115, B 120, and additional memory arrays C 117 and D 122 having faulty memory locations. As shown in FIG. 17, memory array A 115 is segmented into two physical sections. The first section 405 contains rows having all good memory locations, and the second section 410 contains rows having one or more faulty memory locations. The memory array B 120 is segmented into three physical sections. The first section 441 contains rows having one or more faulty memory locations, the second section 442 contains rows having all good memory locations, and the third section 443 contains rows having one or more faulty memory locations. Similarly, memory array C 117 is segmented into three physical sections. The first section 427 contains rows having one or more faulty memory locations, the second section 426 contains rows having all good memory locations, and the third section 430 contains rows having one or more faulty memory locations. Finally, memory array D 122 is segmented into two physical sections. The first section 429 having one or more faulty memory locations, and the second section 428 contains rows having all good memory locations.

In the embodiment illustrated in FIG. 17, the decoder receives A9, A10, and RAS as inputs, and comprises four output enable signals OEA, OEB, OEC, and OED, each connected to a corresponding DRAM memory array. Operation is analogous to that described above with respect to other embodiments. Specifically, A9 and A10 are latched into the decoder by the falling edge of RAS, and are demultiplexed to assert an appropriate one of the four OE outputs. This ensures that only the memory array having all good memory locations in the system addressed region places data on the data bus during that memory access cycle. As above described, writes are made simultaneously to all four memory arrays, without being affected by the decoder 112.

FIG. 18 is a block diagram of a fourth variation in the design of the second configuration with a transition from four memory arrays to one memory array. This variation shows a memory array design wherein sections of good columns occur in complementary regions in the memory arrays A 115, B 120, and additional memory arrays C 117 and D 122 having faulty memory locations. As shown in FIG. 18, memory array A 115 is segmented into two physical sections. The first section 150 contains columns having all good memory locations, and the second section 155 contains columns having one or more faulty memory locations. The memory array B 120 is segmented into three physical sections. The first section 195 contains columns having one or more faulty memory locations, the second section 196 contains columns having all good memory locations, and the third section 197 contains columns having one or more faulty memory locations. Similarly, memory array C 117 is segmented into three physical sections. The first section 198 contains columns having one or more faulty memory locations, the second section 199 contains columns having all good memory locations, and the third section 200 contains columns having one or more faulty memory locations. Finally, memory array D 122 is segmented into two physical sections. The first section 154 contains columns having one or more faulty memory locations, and the second section 153 contains columns having all good memory locations. The encoder used with DRAM memory arrays having boundaries as shown in FIG. 18 functions similarly to that described with respect to FIG. 17, except CAS is routed to the decoder 112 rather than RAS.

Figure 19:
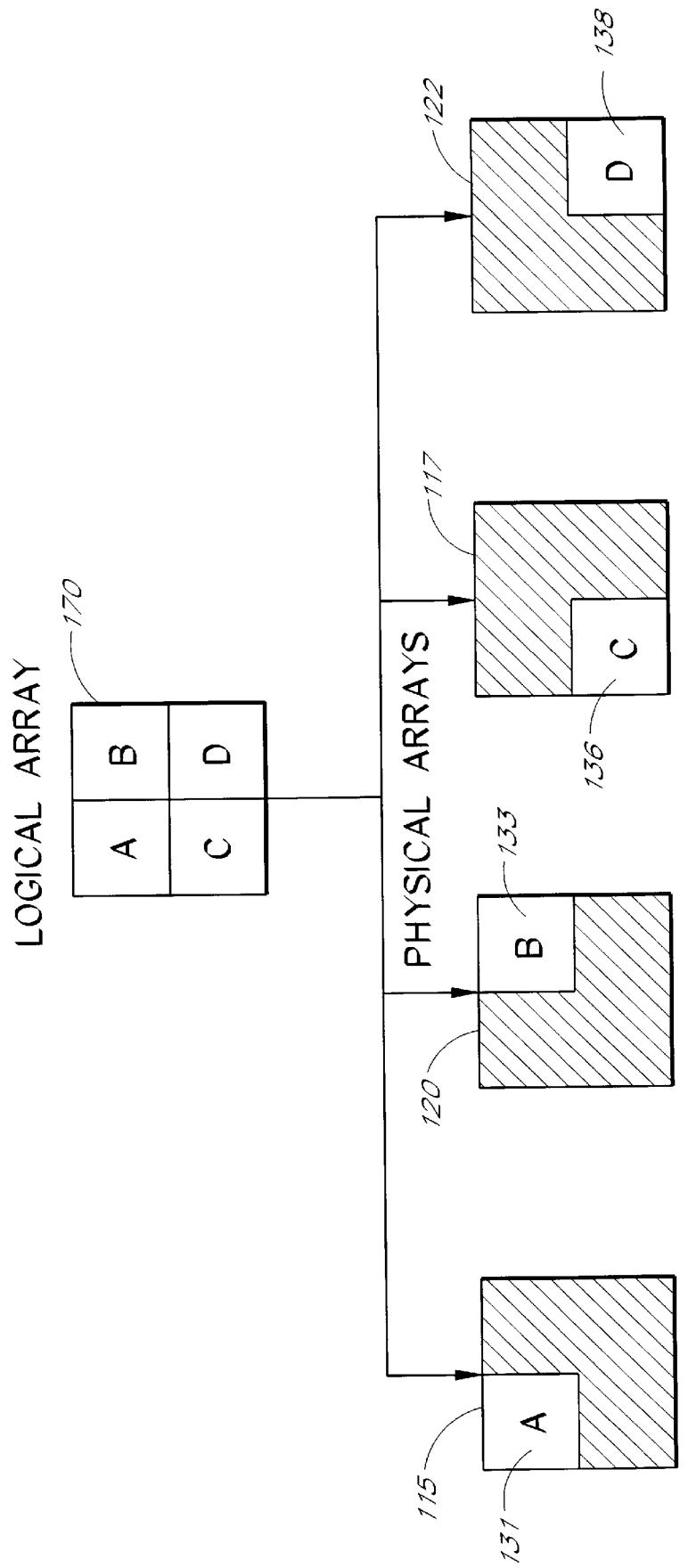
FIG. 19. is a block diagram of a fifth variation in the design of the second configuration with a transition from four memory arrays to one memory array.
Figure 20:
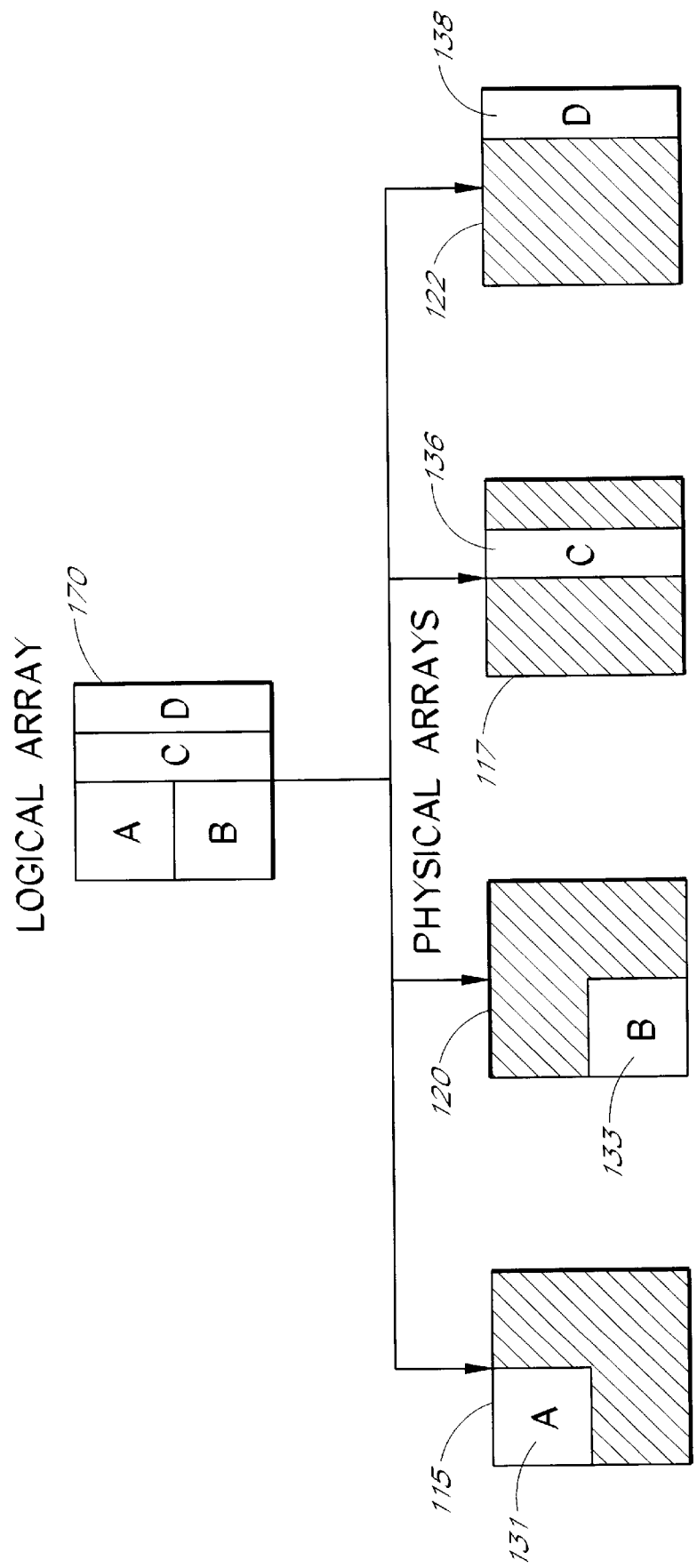
FIG. 20. is a block diagram of a sixth variation in the design of the second configuration with a transition from four memory arrays to one memory array.

FIGS. 19 and 20 are block diagrams of DRAM memory arrays which require the decoder 112 to select one of four output enable signals based on both a portion of the row address and a portion of the column address. In each case, four memory arrays 115, 120, 117, 122 have all good memory regions 131, 133, 136, 138, which for illustrative purposes, are assumed to each comprise one-forth of the 2048×2048 total space of addressable memory locations. In both of these illustrated cases, both RAS and CAS would be provided to the decoder 112 as inputs.

For the embodiment of FIG. 19, only address bit A10 is needed by the decoder. Bit A10 of the row address and bit A10 of the column address are both used to select one of the four output enable signals OEA, OEB, OEC, and OED. For example, "00" would select OEA, and "10" would select OEC. For the embodiment of FIG. 20, A10 of the row address and both A9 and A10 of the column address must be used to select one of the output enable signals OEA, OEB, OEC, and OED. For example, if A10 of row address is 1, and A10 of the column address is 0, OEB is selected. If A10 of the column address is 1, and A9 of the column address is 0, OEC is selected. As before, the complementary nature of the all good memory regions of the memory arrays in both the FIG. 19 and FIG. 20 allows proper functionality when writes are simultaneously performed to all memory arrays without being affected by the decoder.

The present invention thus provides an important and advantageous alternative to the memory module designer. DRAMs with large numbers of faulty locations can be efficiently and cost effectively utilized, especially when the faults are localized in specific regions of the DRAM address space. Rather than creating complex and expensive decoders and/or memory fault maps which can be used with DRAMs having essentially any configuration of good/faulty locations, the module designer can use very simple decoder circuitry by carefully matching DRAMs with overlapping and/or complementary all good regions of memory address space.

While the present invention has been described in terms of various embodiments, it will be apparent to those having ordinary skill in the art that several changes, modifications, or alterations to the present invention may be made, none of which depart from the spirit or scope of the present invention. All such changes, modifications, and alterations should therefore be viewed as within the scope of the present invention.

What is claimed is:

1. A memory system comprising:

a memory controller;

a first memory array comprising at least one section having all good memory locations, and at least one section having at least one faulty memory location;

a second memory array comprising at least one section having all good memory locations, and at least one section having at least one faulty memory location; and a decoder coupled to said memory controller, said first memory array, and said second memory array, said decoder being responsive to said memory controller for selectively enabling data transfer between said controller and the sections of the first and second memory arrays having all good memory locations.

2. The system as defined in claim 1, wherein the sum of the memory locations in the sections of the first and second memory arrays having all good memory locations equals approximately the total number of memory locations in said first memory array.

3. The system as defined in claim 1, wherein said at least one section having all good memory locations in said first memory array comprises one half of an address space defined by said first memory array, and wherein said at least one section having at least one faulty memory location in said first memory array comprises one half of said address space.

4. The system as defined in claim 3, wherein said at least one section having all good memory locations in said second memory array comprises one half of an address space defined by said second memory array, and wherein said at least one section having at least one faulty memory location in said second memory array comprises one half of said address space.

5. The system as defined in claim 3, wherein the decoder is configured to direct data having an address in the section of the first memory array having all good memory locations to its original address.

6. The system as defined in claim 3, wherein the decoder is configured to redirect data having an address in the section of the first memory array having at least one faulty memory location to the section of the second memory array having all good memory locations.

7. The system as defined in claim 3, wherein the decoder enables the data stored in the section of the first memory array having all good memory locations to be retrieved from its original address.

8. The system as defined in claim 3, wherein the decoder enables the data stored in the section of the second memory array having all good memory locations to be retrieved in response to a request for retrieval of data which is addressed to the section of the first memory array having at least one faulty memory location.

9. The system as defined in claim 1, wherein said memory locations are defined by addresses, and wherein said addresses comprise at least one significant bit having one of two logical states.

10. The system as defined in claim 5, wherein the at least one significant bit defines a boundary separating the sections having all good memory locations from the sections having at least one faulty memory location in the first memory array.

11. A memory system comprising:

a memory controller;

a first memory array having at least one good and at least one faulty memory location;

a second memory array having at least one good and at least one faulty memory location;

a decoder responsive to the memory controller for enabling data storage in and retrieval from at least one of the first and second memory arrays, so that the first and second memory arrays appear to the memory controller as a single memory array having all good memory locations.

12. The system of claim 11 wherein said memory controller is configured to output a row address comprising a plurality of row address bits, and wherein said decoder is responsive to fewer than three of said plurality of row address bits.

13. The system of claim 12 wherein said decoder is responsive to a single row address bit.

14. The system of claim 11 wherein said memory controller is configured to output a column address comprising a plurality of column address bits, and wherein said decoder is responsive to fewer than three of said plurality of column address bits.

15. The system of claim 14 wherein said decoder is responsive to a single column address bit.

16. The system as defined in claim 11, wherein the first memory array is segmented into at least one section having all good memory locations and at least one section having at least one faulty memory location, and wherein the second memory array is segmented into at least one section having all good memory locations and at least one section having at least one faulty memory location.

17. The system as defined in claim 16, wherein said memory locations are each defined by a row address comprising a plurality of bits and a column address comprising a plurality of bits, and wherein said sections are defined by logical states of fewer than six row and column address bits.

18. The system as defined in claim 17, wherein said sections are defined by a logical state of a single row address bit.

19. The system as defined in claim 16, wherein said at least one section of the first memory array having all good memory locations occupies a portion of memory address space which is complementary to and contiguous with the portion of address space occupied by said at least one section of the second memory array having all good memory locations.

* * * * *